US010621023B2

(12) United States Patent
Tsern et al.

(10) Patent No.: US 10,621,023 B2
(45) Date of Patent: *Apr. 14, 2020

(54) MEMORY CONTROLLER WITH ERROR DETECTION AND RETRY MODES OF OPERATION

(71) Applicant: Rambus Inc., Sunnyvale, CA (US)

(72) Inventors: Ely K. Tsern, Los Altos, CA (US); Mark A. Horowitz, Menlo Park, CA (US); Frederick A. Ware, Los Altos Hills, CA (US)

(73) Assignee: Rambus Inc., Sunnyvale, CA (US)

(*) Notice: Subject to any disclaimer, the term of this patent is extended or adjusted under 35 U.S.C. 154(b) by 81 days.

This patent is subject to a terminal disclaimer.

(21) Appl. No.: 16/120,819

(22) Filed: Sep. 4, 2018

(65) Prior Publication Data

US 2019/0095264 A1 Mar. 28, 2019

Related U.S. Application Data

(63) Continuation of application No. 14/855,271, filed on Sep. 15, 2015, now Pat. No. 10,095,565, which is a (Continued)

(51) Int. Cl.
*G06F 11/07* (2006.01)
*G06F 11/10* (2006.01)
(Continued)

(52) U.S. Cl.
CPC .......... *G06F 11/073* (2013.01); *G06F 3/064* (2013.01); *G06F 3/0619* (2013.01);
(Continued)

(58) Field of Classification Search
CPC .............. G06F 11/073; G06F 11/0745; G06F 11/0766; G06F 11/1008; G06F 11/141;
(Continued)

(56) References Cited

U.S. PATENT DOCUMENTS 3,585,378 A 5/1971 Bouricius et al.
3,823,387 A 7/1974 McClellan
(Continued)

OTHER PUBLICATIONS

Cardarilli et al., "Design of a Fault Tolerant Solid State Mass Memory," IEEE Transactions of Reliability, vol. 52, No. 4, Dec. 2003, pp. 476-491. 16 pages.
(Continued)

*Primary Examiner* — Joseph D Torres

(57) ABSTRACT

A memory system includes a link having at least one signal line and a controller. The controller includes at least one transmitter coupled to the link to transmit first data, and a first error protection generator coupled to the transmitter. The first error protection generator dynamically adds an error detection code to at least a portion of the first data. At least one receiver is coupled to the link to receive second data. A first error detection logic determines if the second data received by the controller contains at least one error and, if an error is detected, asserts a first error condition. The system includes a memory device having at least one memory device transmitter coupled to the link to transmit the second data. A second error protection generator coupled to the memory device transmitter dynamically adds an error detection code to at least a portion of the second data.

21 Claims, 9 Drawing Sheets

Related U.S. Application Data continuation of application No. 14/827,978, filed on Aug. 17, 2015, now Pat. No. 9,665,430, which is a continuation of application No. 12/940,942, filed on Nov. 5, 2010, now Pat. No. 9,141,479, which is a continuation of application No. 11/145,429, filed on Jun. 3, 2005, now Pat. No. 7,831,882.

(51) Int. Cl.
| | |
|---|---|
| *G06F 11/14* | (2006.01) |
| *G06F 11/20* | (2006.01) |
| *H03M 13/03* | (2006.01) |
| *H04L 1/00* | (2006.01) |
| *H04L 1/08* | (2006.01) |
| *H04L 1/18* | (2006.01) |
| *G06F 11/00* | (2006.01) |
| *G11C 29/52* | (2006.01) |
| *G06F 3/06* | (2006.01) |

(52) U.S. Cl.
CPC .......... *G06F 3/0673* (2013.01); *G06F 11/006* (2013.01); *G06F 11/0745* (2013.01); *G06F 11/0766* (2013.01); *G06F 11/0793* (2013.01); *G06F 11/10* (2013.01); *G06F 11/1008* (2013.01); *G06F 11/1068* (2013.01); *G06F 11/1076* (2013.01); *G06F 11/141* (2013.01); *G06F 11/1402* (2013.01); *G06F 11/1443* (2013.01); *G06F 11/20* (2013.01); *G11C 29/52* (2013.01); *H03M 13/03* (2013.01); *H04L 1/004* (2013.01); *H04L 1/0057* (2013.01); *H04L 1/0061* (2013.01); *H04L 1/0072* (2013.01); *H04L 1/08* (2013.01); *H04L 1/1809* (2013.01)

(58) Field of Classification Search
CPC ........ G06F 11/20; H04L 1/004; H04L 1/0072; H03M 13/03
See application file for complete search history.

(56) References Cited

U.S. PATENT DOCUMENTS

| | | |
|---|---|---|
| 3,893,072 A | 7/1975 | D'Antonio et al. |
| 4,054,911 A | 10/1977 | Fletcher et al. |
| 4,162,536 A | 7/1979 | Morley |
| 4,354,225 A | 10/1982 | Frieder et al. |
| 4,359,771 A | 11/1982 | Johnson et al. |
| 4,363,125 A | 12/1982 | Brewer et al. |
| 4,369,510 A | 1/1983 | Johnson et al. |
| 4,394,763 A | 7/1983 | Nagano et al. |
| 4,434,487 A * | 2/1984 | Rubinson ........... G11B 20/1252 360/53 |
| 4,456,993 A | 6/1984 | Taniguchi et al. |
| 4,468,731 A | 8/1984 | Johnson et al. |
| 4,527,237 A | 7/1985 | Frieder et al. |
| 4,535,455 A | 8/1985 | Peterson |
| 4,543,628 A | 9/1985 | Pomfret |
| 4,561,024 A | 12/1985 | Tamura |
| 4,584,685 A | 4/1986 | Gajjar |
| 4,596,014 A | 6/1986 | Holeman |
| 4,597,084 A | 6/1986 | Dynneson et al. |
| 4,604,750 A | 8/1986 | Manton et al. |
| 4,648,064 A | 3/1987 | Morley |
| 4,672,609 A * | 6/1987 | Humphrey ........... G06F 11/0751 714/719 |
| 4,792,923 A | 12/1988 | Nakase et al. |
| 4,814,903 A | 3/1989 | Kulakowski et al. |
| 4,862,462 A * | 8/1989 | Zulian ................ G06F 11/1048 714/758 |
| 4,888,773 A | 12/1989 | Arlington |
| 4,899,342 A | 2/1990 | Potter et al. |
| 4,914,657 A | 4/1990 | Walter et al. |
| 4,920,539 A | 4/1990 | Albonesi |
| 4,924,456 A | 5/1990 | Maxwell et al. |
| 4,970,714 A | 11/1990 | Chen et al. |
| 5,065,312 A | 11/1991 | Bruckert et al. |
| 5,070,474 A | 12/1991 | Tuma et al. |
| 5,173,905 A | 12/1992 | Parkinson et al. |
| 5,193,181 A | 3/1993 | Barlow et al. |
| 5,218,691 A | 6/1993 | Tuma et al. |
| 5,313,627 A | 5/1994 | Amini et al. |
| 5,347,643 A | 9/1994 | Kondo et al. |
| 5,369,651 A | 11/1994 | Marisetty |
| 5,386,517 A | 1/1995 | Sheth et al. |
| 5,392,302 A | 2/1995 | Kemp et al. |
| 5,404,361 A | 4/1995 | Casorso et al. |
| 5,450,609 A | 9/1995 | Schultz et al. |
| 5,488,691 A | 1/1996 | Fuoco et al. |
| 5,490,153 A | 2/1996 | Gregg et al. |
| 5,502,733 A | 3/1996 | Kishi et al. |
| 5,519,883 A | 5/1996 | White et al. |
| 5,550,988 A | 8/1996 | Sarangdhar et al. |
| 5,553,231 A | 9/1996 | Papenberg et al. |
| 5,559,956 A | 9/1996 | Sukegawa |
| 5,588,112 A | 12/1996 | Dearth et al. |
| 5,657,331 A | 8/1997 | Metzner et al. |
| 5,687,183 A | 11/1997 | Chesley |
| 5,729,550 A | 3/1998 | Nakajima et al. |
| 5,751,932 A | 5/1998 | Horst et al. |
| 5,751,955 A | 5/1998 | Sonnier et al. |
| 5,778,419 A | 7/1998 | Hansen et al. |
| 5,784,390 A | 7/1998 | Masiewicz et al. |
| 5,828,677 A | 10/1998 | Sayeed et al. |
| 5,838,899 A | 11/1998 | Leavitt et al. |
| 5,841,795 A | 11/1998 | Olarig et al. |
| 5,987,628 A | 11/1999 | Von Bokern et al. |
| 6,003,151 A | 12/1999 | Chuang |
| 6,009,542 A | 12/1999 | Koller et al. |
| 6,012,136 A | 1/2000 | Brown |
| 6,012,839 A | 1/2000 | Nguyen et al. |
| 6,029,264 A | 2/2000 | Kobayashi et al. |
| 6,035,037 A | 3/2000 | Chaney |
| 6,038,679 A | 3/2000 | Hanson |
| 6,048,090 A | 4/2000 | Zook |
| 6,065,146 A | 5/2000 | Bosshart |
| 6,075,744 A | 6/2000 | Tsern et al. |
| 6,081,145 A | 6/2000 | Bandai et al. |
| 6,094,732 A | 7/2000 | Takano |
| 6,115,763 A | 9/2000 | Douskey |
| 6,125,470 A | 9/2000 | Hee et al. |
| 6,147,913 A | 11/2000 | Yu et al. |
| 6,151,689 A | 11/2000 | Garcia et al. |
| 6,189,123 B1 | 2/2001 | Anders Nystrom et al. |
| 6,208,663 B1 | 3/2001 | Schramm et al. |
| 6,212,660 B1 | 4/2001 | Joeressen et al. |
| 6,243,845 B1 | 6/2001 | Tsukamizu et al. |
| 6,247,144 B1 * | 6/2001 | Macias-Garza ..... G06F 9/30032 714/25 |
| 6,249,894 B1 | 6/2001 | Lin et al. |
| 6,269,464 B1 | 7/2001 | Boussina et al. |
| 6,308,294 B1 | 10/2001 | Ghosh et al. |
| 6,314,541 B1 | 11/2001 | Seytter et al. |
| 6,345,370 B1 | 2/2002 | Kwon |
| 6,367,048 B1 | 4/2002 | McAuliffe et al. |
| 6,373,842 B1 | 4/2002 | Coverdale et al. |
| 6,393,504 B1 | 5/2002 | Leung et al. |
| 6,397,365 B1 | 5/2002 | Brewer et al. |
| 6,438,723 B1 | 8/2002 | Kalliojarvi |
| 6,467,022 B1 | 10/2002 | Buckland et al. |
| 6,507,928 B1 | 1/2003 | Richardson |
| 6,529,561 B2 | 3/2003 | Sipola |
| 6,545,994 B2 | 4/2003 | Nelson et al. |
| 6,553,003 B1 | 4/2003 | Chang |
| 6,560,725 B1 | 5/2003 | Longwell et al. |
| 6,609,167 B1 | 8/2003 | Bastiani et al. |
| 6,625,749 B1 | 9/2003 | Quach |
| 6,646,911 B2 | 11/2003 | Hidaka |
| 6,697,986 B2 | 2/2004 | Kim et al. |
| 6,700,867 B2 | 3/2004 | Classon et al. |
| 6,704,898 B1 | 3/2004 | Furuskar et al. |

(56) References Cited

U.S. PATENT DOCUMENTS

| | | | |
|---|---|---|---|
| 6,715,116 | B2 | 3/2004 | Lester et al. |
| 6,725,414 | B2 | 4/2004 | Seyyedy |
| 6,735,726 | B2 | 5/2004 | Muranaka et al. |
| 6,742,159 | B2 | 5/2004 | Sakurai |
| 6,745,364 | B2 | 6/2004 | Bhatt et al. |
| 6,754,856 | B2 | 6/2004 | Cofler et al. |
| 6,760,814 | B2 | 7/2004 | Corrigan |
| 6,778,454 | B2 | 8/2004 | Duh et al. |
| 6,779,148 | B2 | 8/2004 | Tanaka |
| 6,779,150 | B1 | 8/2004 | Walton et al. |
| 6,792,501 | B2 | 9/2004 | Chen et al. |
| 6,823,424 | B2 | 11/2004 | Larson et al. |
| 6,832,340 | B2 | 12/2004 | Larson et al. |
| 6,845,472 | B2 | 1/2005 | Walker et al. |
| 6,851,081 | B2 | 2/2005 | Yamamoto |
| 6,880,103 | B2 | 4/2005 | Kim et al. |
| 6,883,130 | B2 | 4/2005 | Wilhelmsson et al. |
| 6,892,159 | B2 | 5/2005 | Weiss et al. |
| 6,909,758 | B2 | 6/2005 | Ramesh et al. |
| 6,912,682 | B1 | 6/2005 | Aoki |
| 6,931,582 | B2 | 8/2005 | Tamura et al. |
| 6,941,493 | B2 | 9/2005 | Phelps |
| 6,977,888 | B1 | 12/2005 | Frenger et al. |
| 6,990,604 | B2 | 1/2006 | Binger |
| 6,996,750 | B2 * | 2/2006 | Tetreault ............. G06F 11/0745 714/43 |
| 7,000,171 | B2 | 2/2006 | Sako et al. |
| 7,027,539 | B2 | 4/2006 | Yang et al. |
| 7,047,473 | B2 | 5/2006 | Hwang et al. |
| 7,072,307 | B2 | 7/2006 | Tong et al. |
| 7,168,023 | B2 | 1/2007 | Morgan et al. |
| 7,200,770 | B2 | 4/2007 | Hartwell et al. |
| 7,231,580 | B2 | 6/2007 | Shiota et al. |
| 7,249,289 | B2 | 7/2007 | Muranaka et al. |
| 7,257,762 | B2 | 8/2007 | Holm et al. |
| 7,310,757 | B2 | 12/2007 | Ngo et al. |
| 7,339,759 | B2 | 3/2008 | Hashimoto |
| 7,340,641 | B1 | 3/2008 | Binger |
| 7,418,436 | B2 | 8/2008 | Maeda et al. |
| 7,421,547 | B2 | 9/2008 | Matsui et al. |
| 7,519,894 | B2 | 4/2009 | Wei et al. |
| 7,529,965 | B2 | 5/2009 | Ikeuchi et al. |
| 7,548,495 | B2 | 6/2009 | Kobayashi |
| 7,570,447 | B2 | 8/2009 | Koga et al. |
| 7,624,298 | B2 | 11/2009 | Kasahara et al. |
| 7,634,707 | B2 | 12/2009 | Leung et al. |
| 7,831,882 | B2 | 11/2010 | Tsern et al. |
| 8,352,805 | B2 | 1/2013 | Shaeffer et al. |
| 8,555,116 | B1 | 10/2013 | Shaeffer et al. |
| 8,843,805 | B1 | 9/2014 | Goel et al. |
| 9,170,894 | B2 * | 10/2015 | Shaeffer ............. G06F 11/1004 |
| 2001/0039602 | A1 | 11/2001 | Kanda et al. |
| 2001/0056567 | A1 | 12/2001 | Sakurai |
| 2002/0053042 | A1 | 5/2002 | Brown |
| 2002/0080660 | A1 | 6/2002 | Kanamitsu et al. |
| 2002/0144210 | A1 | 10/2002 | Borkenhagen et al. |
| 2003/0066010 | A1 | 4/2003 | Acton |
| 2003/0088805 | A1 | 5/2003 | Majni et al. |
| 2003/0112685 | A1 | 6/2003 | Duh et al. |
| 2003/0115417 | A1 | 6/2003 | Corrigan |
| 2003/0177434 | A1 | 9/2003 | Su et al. |
| 2004/0002847 | A1 | 1/2004 | Cole et al. |
| 2004/0073649 | A1 | 4/2004 | Inami et al. |
| 2004/0088497 | A1 | 5/2004 | Deans et al. |
| 2004/0139310 | A1 | 7/2004 | Maeda et al. |
| 2004/0205433 | A1 | 10/2004 | Gower et al. |
| 2004/0237001 | A1 | 11/2004 | Schulz et al. |
| 2005/0018514 | A1 | 1/2005 | Knaack et al. |
| 2005/0055522 | A1 | 3/2005 | Yagi |
| 2005/0073899 | A1 | 4/2005 | Gallivan et al. |
| 2005/0262241 | A1 | 11/2005 | Gubbi et al. |
| 2006/0075291 | A1 | 4/2006 | Takahashi |
| 2006/0077750 | A1 | 4/2006 | Pescatore |
| 2006/0098320 | A1 | 5/2006 | Koga et al. |
| 2006/0123483 | A1 | 6/2006 | Cohen |
| 2006/0126460 | A1 | 6/2006 | Kobayashi |
| 2006/0277434 | A1 | 12/2006 | Tsern et al. |
| 2007/0002482 | A1 | 1/2007 | Daikokuya et al. |
| 2007/0011562 | A1 | 1/2007 | Alexander et al. |
| 2007/0043917 | A1 | 2/2007 | Matsui et al. |
| 2007/0104327 | A1 | 5/2007 | Macri et al. |
| 2007/0150872 | A1 | 6/2007 | Vohra |
| 2012/0179866 | A1 | 7/2012 | Davis et al. |

OTHER PUBLICATIONS

Dell Computer Corporation et al., "Serial ATA II: Electrical Specification," Rev. 1, May 26, 2004. 187 pages.

Digital Equipment Corporation, "ESE50 SDI Solid State Disk Service Guide," Jun. 1993. 132 pages.

Digital Equipment Corporation, "ESE50 SDI Solid State Disk User Guide," Jun. 1993. 33 pages.

Digital Equipment Corporation, "Hardware Documentation—Machines DEC—VAX Hardware Reference," printed from http://www.netbsd.org/documentation/hardware/Machines/DEC/vax on May 13, 2005. 91 pages.

Digital Equipment Corporation, "Software Product Description, Product Name: HSC High Performance Software, Ver. 8.6," Jun. 1996. 6 pages.

Digital Equipment Corporation, "Software Product Description, Product Name: HSC Software, Ver. 6.5," Jun. 1992. 4 pages.

Grosspietsch et al., "A Memory Interface Chip Designed for Fault Tolerance," VLSI System Design, Jun. 1987, pp. 112-118. 5 pages.

Grosspietsch et al., "The VLSI Implementation of a Fault-Tolerant Memory Interface—a Status Report," VLSI '85, 1986, pp. 155-164. 10 pages.

Haas et al., "Advances in Server Memory Technology," presented at Spring 2005 Intel Developers Forum, San Francisco, CA, Mar. 1, 2005. 31 pages.

Hanna, P., "Error Detection and Correction," Lecture 9, Queen's University—Belfast, Jan. 3, 2005. 12 pages.

Hodgart et al., "A (16,8) Error Correcting Code (T=2) for Critical Memory Applications," DASIA2000, Montreal, Canada, May 22-26, 2000. 4 pages.

Kilbuck et al., "Fully Buffered DIMM—Unleashing Server Capacity," Micron Technology, Inc., Apr. 8, 2005. 199 pages.

May et al., "HiPER: A Compact Narrow Channel Router with Hop-by-Hop Error Correction," IEEE Transactions on Parallel and Distributed Systems, vol. 13, No. 5, May 2002, pp. 485-498. 14 pages.

MMCA Technical Committee, "The MultiMediaCard," System Secification, Version 3.31, May 2003. 150 pages.

PCT International Preliminary Report on Patentability dated Aug. 12, 2008 in International Application No. PCT/US2007/011733. 22 pages.

PCT International Search Report and Written Opinion dated Jan. 11, 2008 in International Application No. PCT/US2007/011733. 13 pages.

PCT International Search Report and Written Opinion dated Mar. 6, 2007 in International Application No. PCT/US2006/020698. 16 pages.

Pearson Education, "Error Detection and Correction," Logic and Computer Design Fundamentals, 3rd Ed., 2004, pp. 1-5. 5 pages.

SanDisk Corporation, "Flash ChipSet Product Manual," Revision 5, Oct. 1998. 134 pages.

SanDisk Corporation, "SanDisk SD Card: Product Manual," Version 2.2, Document No. 80-13-00169, Nov. 2004. 123 pages.

Sidiropoulos et al., "A 700 Mb/s/pin CMOS Signaling Interface Using Current Integrating Receivers," IEEE Journal of Solid-State Circuits, vol. 32, No. 5, pp. 681-690, May 1997. 10 pages.

Siewiorek, Dan, "20 Fault Tolerance & Memory Hierarchy," Lecture Handout, Carnegie Mellon University, Nov. 23, 1998. 18 pages.

Wicker, Stephen B., "Error Control Systems for Digital Communications and Storage," Prentice-Hall, 1995, pp. 392-423. 17 pages.

* cited by examiner

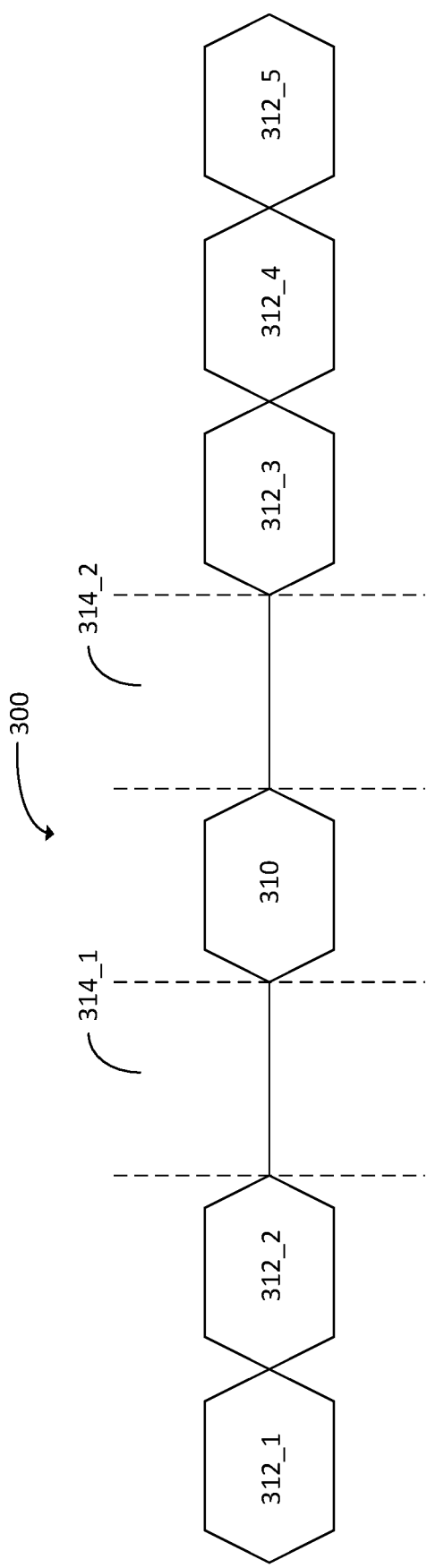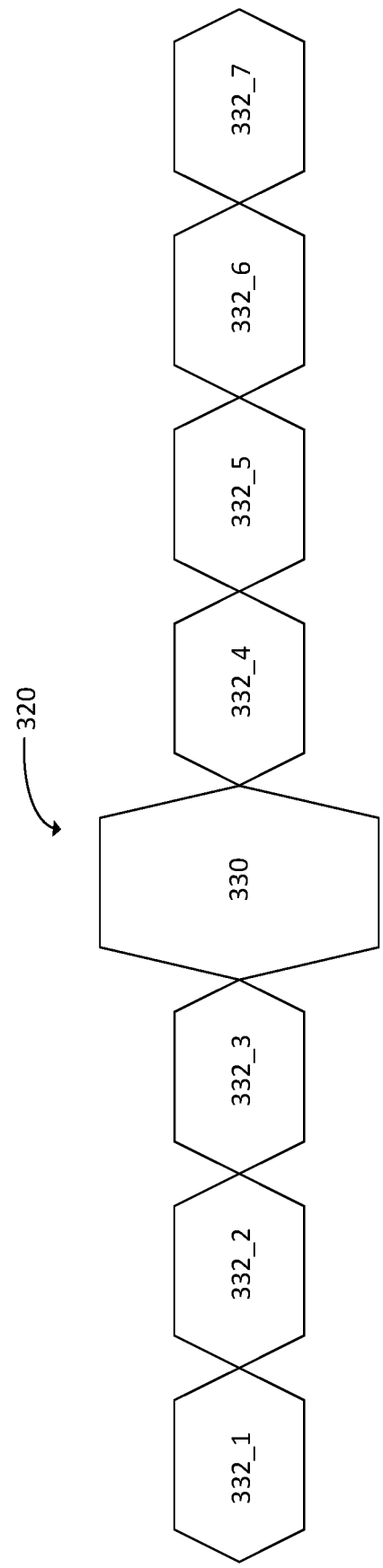

MEMORY CONTROLLER WITH ERROR DETECTION AND RETRY MODES OF OPERATION

RELATED APPLICATIONS

This application is a continuation of U.S. patent application Ser. No. 14/855,271, filed Sep. 15, 2015, which is a continuation of U.S. patent application Ser. No. 14/827,978, filed Aug. 17, 2015 (now U.S. Pat. No. 9,665,430), which is a continuation of U.S. patent application Ser. No. 12/940,942, filed Nov. 5, 2010 (now U.S. Pat. No. 9,141,479), which is a continuation of U.S. patent application Ser. No. 11/145,429, filed Jun. 3, 2005 (now U.S. Pat. No. 7,831,882), each entitled "Memory System with Error Detection and Retry Modes of Operation." Each aforesaid patent application and/or patent which is incorporated by reference herein in its entirety.

FIELD

The subject matter disclosed herein relates generally to the memory systems, and in particular to memory systems having error detection, error correction and/or retry modes of operation.

BACKGROUND

Low bit-error-rate (BER) communication of data over a communications channel is often considered an important requirement in many systems. In the case of memory devices and systems, fulfilling this requirement is increasingly difficult due to signaling and circuit limitations. In future memory devices and systems, scaling of interface circuitry to accommodate higher data rates may be restricted by transistor sensitivity and threshold limits. In addition, even though interconnect lengths and a loss tangent may be constant, the higher data rates will increase noise due to an increased bandwidth. Given constraints on interface overhead and latency, developing faster interfaces with a low BER may become more challenging and expensive. This poses a problem, since conventional interfaces in memory devices and systems typically have an extremely low BER. For example, the BER in the interface in a dynamic random access memory (DRAM) is typically less than a soft error rate in the DRAM core, i.e., less than $10^{-30}$. If the BER in the interface increases in future high-speed designs, ensuring reliability with different processes, systems and environments for conventional memory devices and systems may be difficult.

BRIEF DESCRIPTION OF THE DRAWINGS

For a better understanding, reference should be made to the following detailed description taken in conjunction with the accompanying drawings, in which:

FIG. 3A is a diagram illustrating a data stream in an embodiment of a memory system.

FIG. 3B is a diagram illustrating a data stream in an embodiment of a data stream.

Like reference numerals refer to corresponding parts throughout the drawings.

DETAILED DESCRIPTION OF EMBODIMENTS

Figure 1:
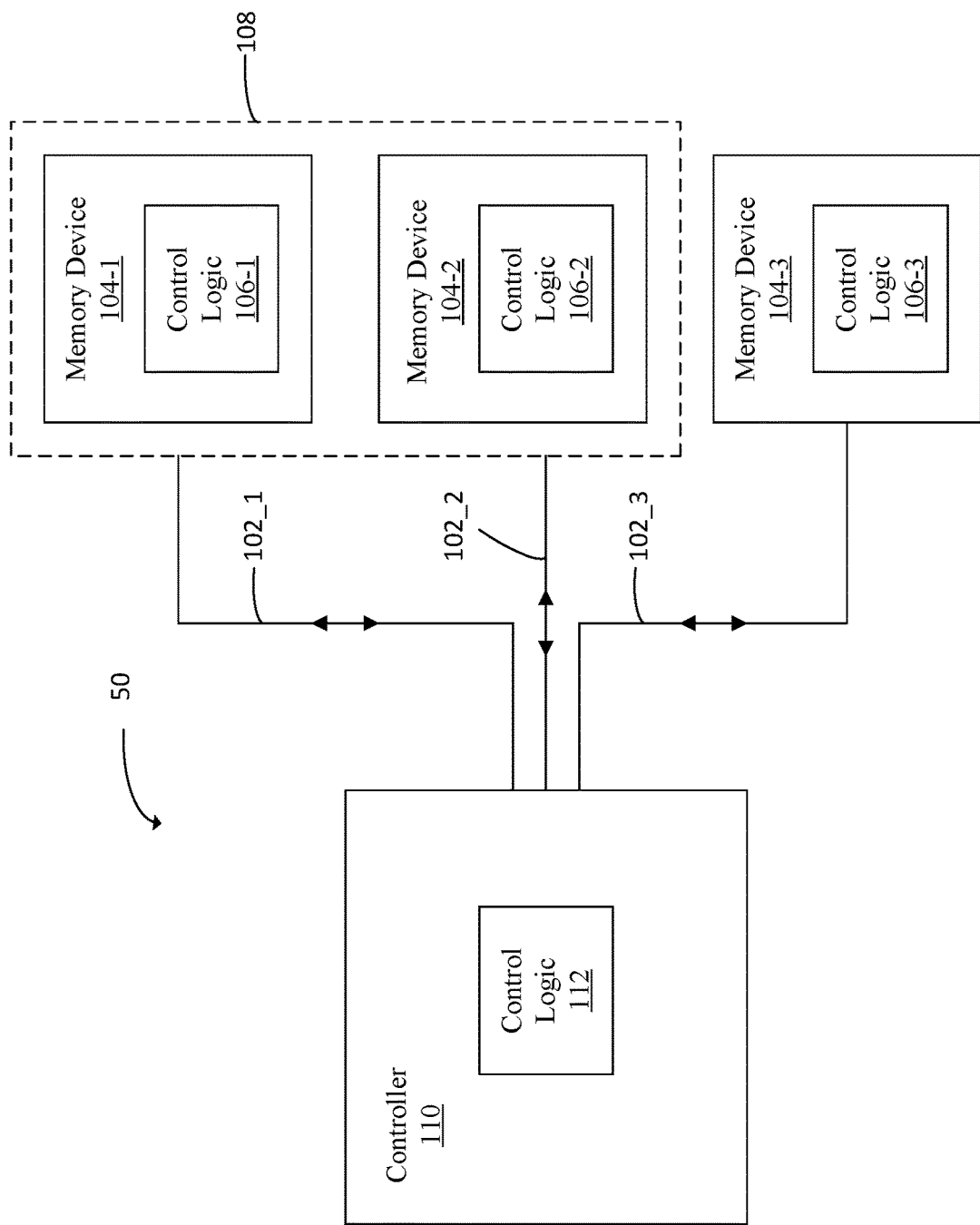
FIG. 1 is a block diagram illustrating an embodiment of a memory system.

A memory controller is described. The controller includes a link interface, at least one transmitter coupled to the link interface to transmit first data and an error protection generator coupled to the transmitter. The error protection generator dynamically adds an error detection code to at least a portion of the first data. Dynamic adding should be understood to refer to incorporating pre-existing error detection code information into at least a portion of the transmit data (such as in one or more data packets), and/or generating error detection code information in real time in accordance with at least a portion of the transmit data, which is then incorporated in at least the portion of the first data. In some embodiments, the error protection generator may dynamically add an error correction code to at least a portion of the first data. Dynamic should be understood to refer to incorporating pre-existing error correction code information into at least a portion of the first data (such as in one or more data packets), and/or generating error correction code information in real time in accordance with at least a portion of the first data, which is then incorporated in at least the portion of the first data. The controller also includes at least one receiver coupled to the link interface to receive second data, and error detection logic. In some embodiments, the error detection logic determines if the second data received by the controller contains at least one error and, if an error is detected, asserts an error condition. In other embodiments, a memory device, coupled to the controller, determines that the second data received by the memory device from the controller contains at least one error, asserts the respective error condition and notifies the controller. The controller performs a retry remedial action if a respective error condition is asserted.

The retry remedial action may include retry information transmitted from the controller to the memory device. The retry information may include requesting that the memory device re-transmit the second data with at least a portion of the second data having error protection provided by an error correction code that is dynamically generated. In other embodiments, the retry remedial action may be based at least in part on retry information transmitted from the memory device to the controller. In these embodiments, the retry information may include requesting that the controller re-transmit the first data with at least a portion of the first data having error protection provided by an error correction code that is dynamically added by the error protection generator.

The memory may also include control logic. In some embodiments, the controller includes the control logic. The control logic may delay subsequent write operations to the memory device until the retry remedial action is completed, may delay command operations to a location in the memory device corresponding to the first data until the retry remedial action is completed, or may reorder receive data after the retry remedial action is completed in order to restore the second data received from the memory device during remedial action to a position corresponding to an original sequence of command operations.

The memory may also include a memory buffer. The first data to be transmitted to the memory device may be temporarily stored in the memory buffer and, if a read to a location in the memory device corresponding to the first data occurs during the retry remedial action, the first data is obtained from the memory buffer.

In some embodiments, a memory system includes a link having at least one signal line, a controller, and a memory device. The controller includes at least one transmitter coupled to the link to transmit first data, a first error protection generator coupled to the transmitter, at least one receiver coupled to the link to receive second data, and a first error detection logic to determine if the second data received by the controller contains at least one error and, if an error is detected, to assert a first error condition. The first error protection generator dynamically adds an error detection code to at least a portion of the first data. The memory device includes at least one transmitter coupled to the link to transmit the second data, a second error protection generator coupled to the transmitter, at least one receiver coupled to the link to receive the first data, and a second error detection logic to determine if the first data received by the memory device contains at least one error and, if an error is detected, to assert a second error condition. The second error protection generator dynamically adds an error detection code to at least a portion of the second data. If a respective error condition is asserted, the respective error condition is communicated between the controller and the memory device and retry remedial action is performed.

By incorporating error detection, error correction and/or retry modes of operation in the memory controller, the memory device or memory systems including at least one controller and at least one memory device, the embodiments allow occasional interconnect- or communications-channel-induced bit errors and thereby may allow a reduction in the BER requirements of the interconnect. Such an additional degree of freedom may enable memory interconnects having increased bandwidth at lower cost and with less complexity.

Reference will now be made in detail to embodiments, examples of which are illustrated in the accompanying drawings. In the following detailed description, numerous specific details are set forth in order to provide a thorough understanding of the present invention. However, it will be apparent to one of ordinary skill in the art that the present invention may be practiced without these specific details. In other instances, well-known methods, procedures, components, and circuits have not been described in detail so as not to unnecessarily obscure aspects of the embodiments.

FIG. 1 illustrates an embodiment of a memory system 50. The memory system 50 includes at least one controller 110 and one or more memory devices 104. While FIG. 1 illustrates the memory system 50 having one controller 110 and three memory devices 104, other embodiments may have additional controllers and fewer or more memory devices 104. The controller has control logic 112 and each memory device 104 has control logic 106. In other embodiments, some of the memory device 104 may not have the control logic 106. Two or more of the memory devices, such as memory devices 104-1 and 104-2, may be configured as a memory bank 108.

The controller 110 and the memory devices 104 are connected by signal lines 102 that together constitute a communications channel or link. While FIG. 1 illustrates three signal lines 102, other embodiments may have fewer or more signal lines 102. The signal lines 102 may correspond to an interconnect, an interface, a bus, and/or a back plane. The signal lines 102 may be used for inter-chip communication, such as between one or more semiconductor chips or dies, or for communication within a semiconductor chip, also known as intra-chip communication, such as between modules in an integrated circuit.

The signal lines 102 may be used for bi-directional and/or uni-directional communications between the controller 110 and one or more of the memory devices 104. Bi-directional communication may be simultaneous. In some embodiments, one or more of the signal lines 102 and the corresponding transmitters, such as transmitters 134 (FIG. 2A), transmitter/receiver 216 (FIG. 2B) and/or transmitters 214 (FIG. 2B), and receivers, such as receivers 136 (FIG. 2A) and/or receivers 212 (FIG. 2B), may be dynamically configured, for example, by control logic 112, for bi-directional and/or uni-directional communications.

Figure 4:
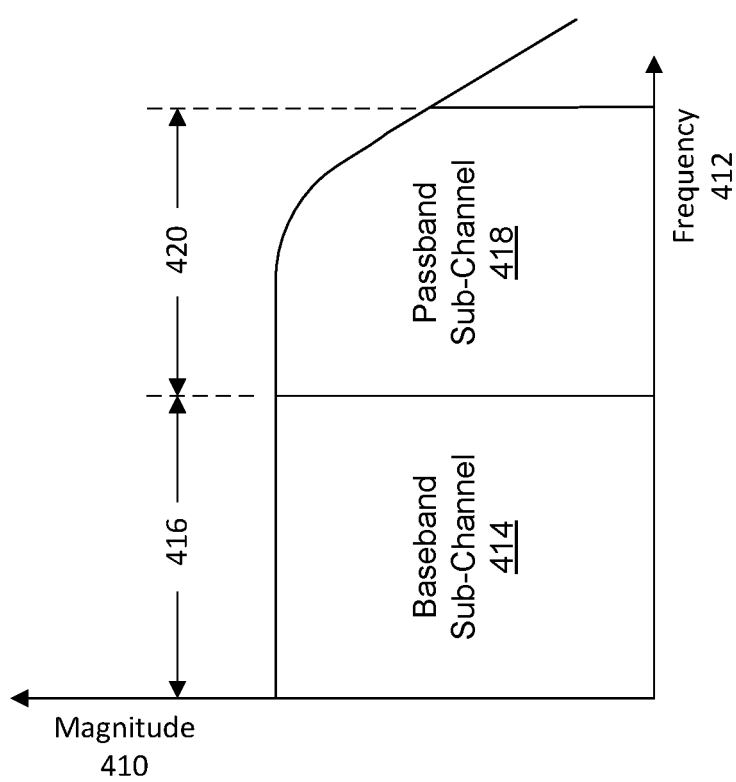
FIG. 4 is a frequency usage diagram illustrating frequency bands of two sub-channels in an embodiment of a memory system.

Data may be communicated on one or more of the signal lines 102 using one or more sub-channels. FIG. 4 shows the frequency response, magnitude 410 as a function of frequency 412, for two such sub-channels. A baseband sub-channel 414 corresponds to a first band of frequencies 416. And a passband sub-channel 418 corresponds to a second band of frequencies 420. In some embodiments, such as those where at least one of the signal lines 102 (FIG. 1) is ac-coupled, the baseband sub-channel 414 may not contain DC (i.e., does not include 0 Hz). While FIG. 4 illustrates two sub-channels, other embodiments may have fewer or more sub-channels. In addition, even though the first frequency band 416 and the second frequency band 420 are illustrated as being orthogonal, in some embodiments there may be substantial overlap of one or more neighboring pairs of frequency bands. A respective sub-channel may also correspond to a group of frequency bands.

Referring to FIG. 1, the control logic 112 may be configured to dynamically allocate and/or adjust one or more bands of frequencies, such as the first band of frequencies 416 (FIG. 4) and/or the second band of frequencies 420 (FIG. 4), based on a predetermined data rate, for example, multiple gigabits per second ("Gbits/s" or "Gbps"), between the controller 110 and at least one of the memory devices 104 and/or the predetermined data rate between at least one of the memory devices 104 and the controller 110. The control logic 112 may dynamically allocate and/or adjust one or more bands of frequencies in at least one signal line 102 by adjusting at least one corresponding transmitter, such as one of the transmitters 134 (FIG. 2A), and at least one corresponding receiver, such as one of the receivers 212 (FIG. 2B). In this example, adjustments to at least one of the transmitters 134 (FIG. 2A) and/or at least one of the receivers 212 (FIG. 2B) may be communicated from the controller 110 to at least one of the memory devices 104 using at least one of the signal lines 102.

Figure 2A:
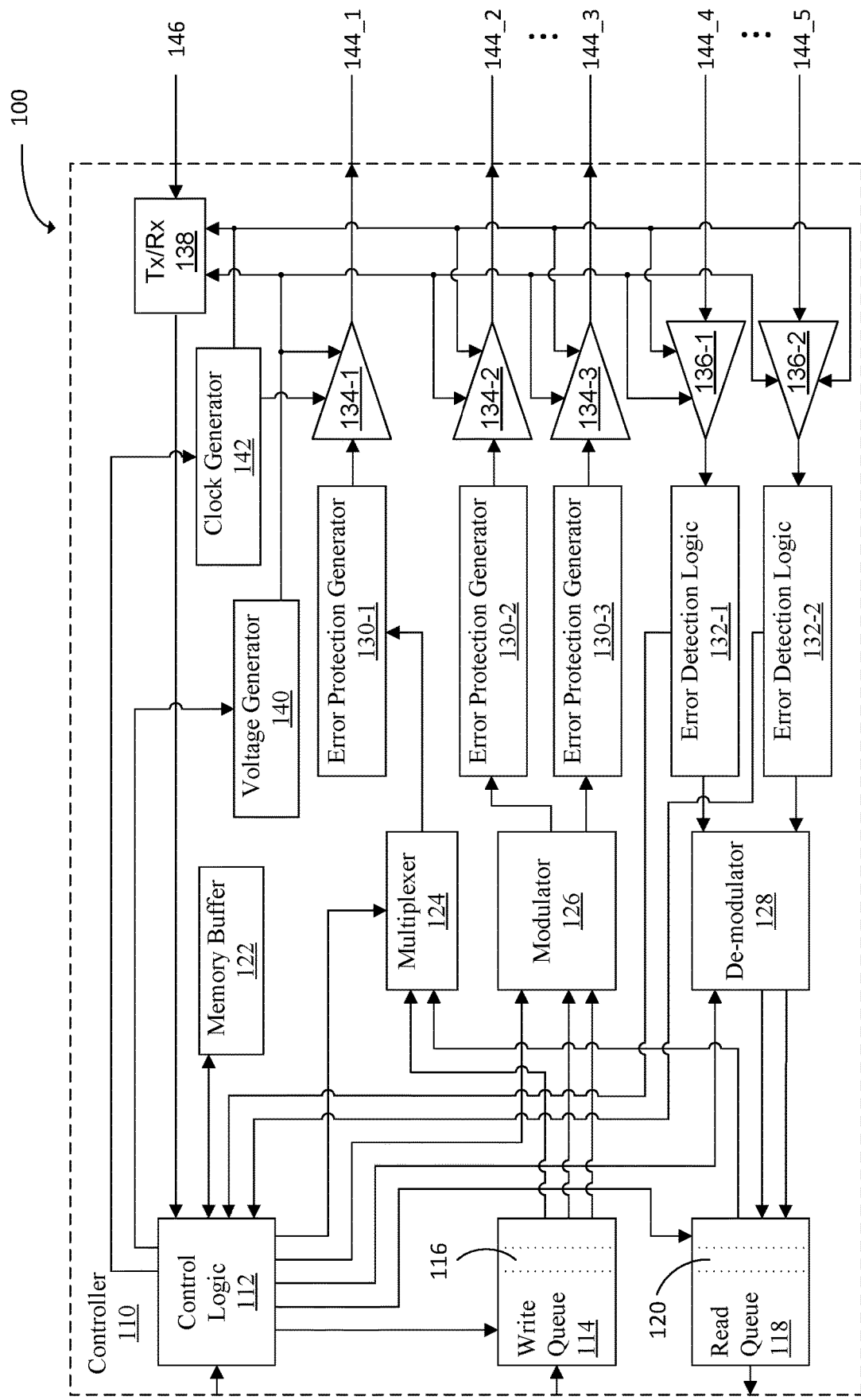
FIG. 2A is a block diagram illustrating an embodiment of a memory device.
Figure 2B:
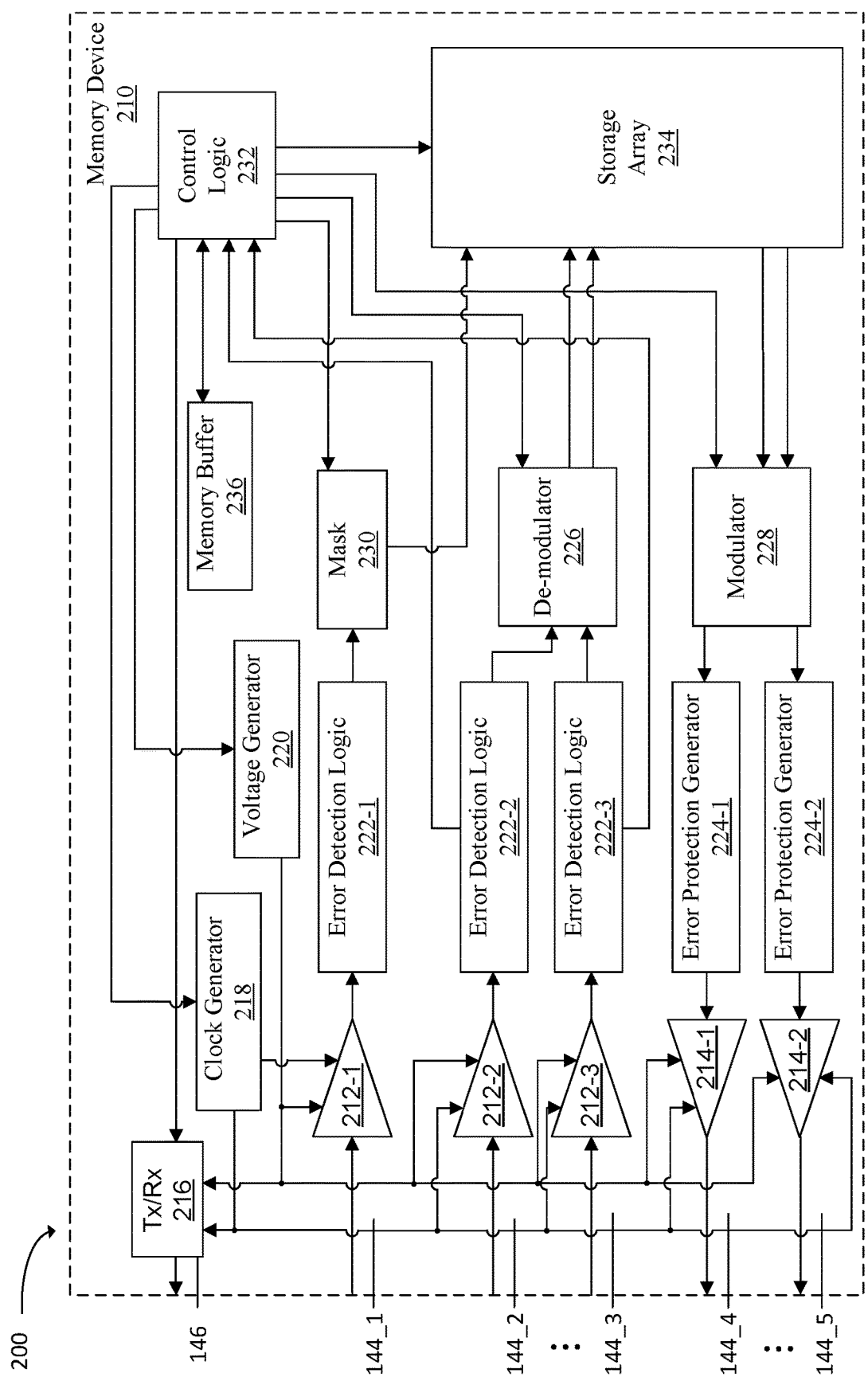
FIG. 2B is a block diagram illustrating an embodiment of a memory device.

FIG. 2A illustrates an embodiment 100 of the controller 110 including the control logic 112, which oversees operation of the controller 110. Data enters a write queue 114. Respective write data 116 is coupled to a modulator 126, at least one error protection generator 130 and at least one of the transmitters 134. At least one of the error protection generators 130 dynamically adds an error detection code, such as one or more parity bits or a parity code, to at least a portion of the respective write data 116. In some embodiments, at least one of the error protection generators 130 may dynamically add an error correction code (ECC), such as a Bose-Chaudhuri-Hochquenghem (BCH) code, to at least a portion of the respective write data 116. At least one of the transmitters 134 transmits the respective write data 116 to at least one memory device, such as one of the memory devices 104 (FIG. 1), using at least one signal line 144. In some embodiments, at least one of the transmitters 134 may also perform a parallel-to-serial conversion.

Read data on at least one of the signal lines 144 is received from at least one memory device, such as one of the memory devices 104 (FIG. 1), using at least one of the receivers 136. In some embodiments, at least one of the receivers 136 may also perform a serial-to-parallel conversion. The read data is coupled to error detection logic 132 (which includes one or more error detectors), a de-modulator 128 and a read queue 118. The read data includes respective read data 120. In some embodiments, error detection logic 132 determines if the respective read data 120 received by the controller 110 contains at least one error. For example, error detection logic 132 may detect an error using a multi-bit XOR operation in conjunction with one or more parity bits in the respective read data 120. If an error is detected, error detection logic 132 asserts an error condition. In other embodiments, at least one memory device, such as one of the memory devices 104 (FIG. 1), determines that the respective write data 116 received by at least the one memory device from the controller 110 contains at least one error, asserts the respective error condition and notifies the controller 110. As discussed further below, if a respective error condition is asserted, retry logic, which in embodiment 100 is in the control logic 112 but in other embodiments may be a separate component in the controller 110, performs a retry remedial action. The retry logic may include hardware, such as logic gates to detect and/or interpret the respective error condition, and/or software, including instructions corresponding to the retry remedial action. The retry remedial action enables transmit and receive data rates greater than a first threshold with an error rate lower than a second threshold. In some embodiments the first threshold is 1 Gbps, 2 Gbps, 5 Gbps or 10 Gbps. In some embodiments, the second threshold is half or one-quarter the data rate of the first threshold.

The modulator 126 and the de-modulator 128 in the controller 110 implement bit-to-symbol coding and symbol-to-bit coding, respectively. In some embodiments, the modulator 126 and the de-modulator 128 are optional. In some embodiments, the relative order of the modulator 126 and the error protection generators 130, and the de-modulator 128 and the error detection logic 132 may be reversed. Suitable symbol coding may include two or more level pulse amplitude modulation (PAM), such as two-level pulse amplitude modulation (2PAM), four-level pulse amplitude modulation (4PAM), eight-level pulse amplitude modulation (8PAM), sixteen-level pulse amplitude modulation (16PAM) or a higher level pulse amplitude modulation. In embodiments with one or more passband sub-channels, such as the passband sub-channel 418 (FIG. 4), multi-level PAM is also referred to as multi-level on-off keying (OOK), such as two-level on-off keying (2OOK), four-level on-off keying (4OOK), eight-level on-off keying (8OOK) or a higher level on-off keying. Suitable coding in one or more passband sub-channels may also include two or more level quadrature amplitude modulation (QAM).

The controller 110 also includes a control or command link using at least one of the signal lines 144, such as signal line 144_1. Command operations in the write queue 114 and/or the read queue 118 are coupled to a multiplexer 124, at least one of the error protection generators 130 and at least one of the transmitters 134, such as transmitter 134-1. The transmitter 134-1 transmits the command operation on the signal line 144_1.

The controller 110 may also be coupled to a retry link 146, including one or more signal lines and/or sub-channels. Retry information on the retry link 146 is received in one or more receivers, such as transmitter/receiver 138, and coupled to the control logic 112.

The transmitters 134, the receivers 136 and the transmitter/receiver 138 are coupled to at least one voltage generator 140 and at least one clock generator 142. The voltage generator 140 generates one or more voltage signals that set signal levels of one or more of the transmitters 134, the receivers 136 and/or the transmitter/receiver 138. The clock generator 142 generates one or more clock signals that control timing of transmitting and receiving of data by one or more of the transmitters 134, the receivers 136 and/or the transmitter/receiver 138.

In other embodiments, the controller 110 may have fewer or more components. Functions of two or more components (as described above) may be implemented in a single component. Alternatively, functions of some components, such as the modulator 126 and/or the de-modulator 128, may be implemented in additional instances of the components. While the embodiment 100 illustrates one transmitter/receiver 138, one transmitter 134-1, two transmitters 134-2 and 134-3, and two receivers 136, there may be fewer or more of these components. And while the signal lines 144 and 146 have been illustrated as uni-directional, as noted previously one or more of the signal lines may be bi-directional. This may include simultaneous bi-directional communication as well as dynamic configuration of one or more of the signal lines 144 and/or 146.

FIG. 2B illustrates an embodiment 200 of a memory device 210 including control logic 232, which oversees operation of the memory device 210. A read command operation from the controller 110 (FIG. 2A) may be received on signal line 144_1, which is a command link, by receiver 212-1. The receiver 212-1 is coupled at least one error detection logic, such as error detection logic 222-1, mask logic 230 and storage array 234. Read data at a corresponding location in the storage array 234 is coupled to a modulator 228, at least one error protection generator 224 and at least one one of the transmitters 214. In some embodiments, at least one of the transmitters 214 may also perform a parallel-to-serial conversion. The read data includes the respective read data 120 discussed above with respect to FIG. 2A. At least one of the error protection generators 224 dynamically adds an error detection code, such as one or more parity bits or a parity code, to at least a portion of the read data. In some embodiments, at least one of the error protection generators 224 may dynamically add an error correction code (ECC), such as a BCH code, to at least a portion of the read data. At least one of the transmitters 214 transmits the read data to the controller 110 (FIG. 2A) using at least one signal line 144.

Write data on at least one of the signal lines 144 is received from the controller 110 (FIG. 2A) using at least one of the receivers 212. In some embodiments, at least one of the receivers 212 may also perform a serial-to-parallel conversion. The write data is coupled to at least one error detection logic 222, a de-modulator 226 and the storage array 234. The write data includes the respective write data 116 discussed above with respect to FIG. 2A. In some embodiments, at least one error detection logic 222 determines if the respective write data 116 (FIG. 2A) received by the memory device 210 contains at least one error. For example, at least one error detection logic 222 may detect an error using a multi-bit XOR operation in conjunction with one or more parity bits in the respective write data 116 (FIG. 2A). If an error is detected, at least one error detection logic 222 asserts an error condition. In other embodiments, the controller 110 (FIG. 2A) determines that the respective read data 120 (FIG. 2A) received by the controller 110 (FIG. 2A) from the memory device 210 contains at least one error, asserts the respective error condition and notifies the memory device 210. As discussed further below, if a respective error condition is asserted, retry logic, which in embodiment 200 is in the control logic 232 but in other embodiments may be a separate component in the memory device 210, performs a retry remedial action in a mode of operation of the memory device 210. The retry logic may include hardware, such as logic gates to detect and/or interpret the respective error condition, and/or software, including instructions corresponding to the retry remedial action. The retry remedial action enables transmit and receive data rates greater than a first threshold with an error rate lower than a second threshold. In some embodiments the first threshold is 1 Gbps, 2 Gbps, 5 Gbps or 10 Gbps. In some embodiments, the second threshold is half or one-quarter the data rate of the first threshold.

The modulator 228 and the de-modulator 226 in the memory device 210 implement bit-to-symbol coding and symbol-to-bit coding, respectively. In some embodiments, the modulator 228 and the de-modulator 226 are optional. In some embodiments, the relative order of the modulator 228 and the error detection logic 222, and the de-modulator 226 and the error protection generator 224 may be reversed. Suitable symbol coding may include two or more level pulse amplitude modulation (PAM), such as two-level pulse amplitude modulation (2PAM), four-level pulse amplitude modulation (4PAM), eight-level pulse amplitude modulation (8PAM), sixteen-level pulse amplitude modulation (16PAM) or a higher level pulse amplitude modulation. In embodiments with one or more passband sub-channels, such as the passband sub-channel 418 (FIG. 4), multi-level PAM is also referred to as multi-level on-off keying (OOK), such as two-level on-off keying (2OOK) or a higher level on-off keying. Suitable coding in one or more passband sub-channels may also include two or more level quadrature amplitude modulation (QAM).

The memory device 210 may also include the retry link 146, including one or more signal lines and/or sub-channels. Retry information is coupled from the control logic 232 to one or more transmitters, such as the transmitter/receiver 216, and onto the signal line 144.

The transmitters 214, the receivers 212 and the transmitter/receiver 216 are coupled to at least one voltage generator 220 and at least one clock generator 218. The voltage generator 220 generates one or more voltage signals that set signal levels of one or more of the transmitters 214, the receivers 212 and/or the transmitter/receiver 216. The clock generator 218 generates one or more clock signals that control timing of transmitting and receiving of data by one or more of the transmitters 214, the receivers 212 and/or the transmitter/receiver 216.

In other embodiments, the memory device 210 may have fewer or more components. Functions of two or more components may be implemented in a single component. Alternatively, functions of some components, such as the modulator 228 and/or the de-modulator 226, may be implemented in additional instances of the components. While the embodiment 200 illustrates one receiver 212-1, one transmitter/receiver 216, two transmitters 214 and two receivers 212-2 and 212-3, there may be fewer or more of these components. And while the signal lines 144 and 146 have been illustrated as uni-directional, as noted previously one or more of the signal lines may be bi-directional. This may include simultaneous bi-directional communication as well as dynamic configuration of one or more of the signal lines 144 and/or 146.

Referring to FIG. 2A, as mentioned previously, when the respective error condition is asserted, the controller 110 may enter a mode of operation where the retry logic performs the retry remedial action. In some embodiments, the retry remedial action may include retry information transmitted from the controller 110 to a memory device (such as one of the memory devices 104, FIG. 1, or the memory device 210, FIG. 2B) from which corrupted data (e.g., respective read data 120 containing at least one error) was received. The retry information may include a request that the memory device re-transmit the respective read data 120, or it may include a request that the memory device re-transmit the respective read data 120 with at least a portion of the respective read data 120 having error protection. The error protection may be provided by one or more ECC values that are dynamically generated in the memory device using, for example, at least one of the error protection generators 224.

The ECC values may include BCH codes. BCH codes are a sub-class of cyclic codes. The BCH codes have a range of code lengths and effectiveness, i.e., code gain, in correcting errors. Overhead associated with BCH codes ranges from around 65 to 100%. An important subclass of the BCH codes are Reed-Solomon codes. The Reed-Solomon codes are linear block codes. They are specified as RS(n,k), where k is a number of data symbols having s bits, n is a number of symbol codewords. As a consequence, there are n-k parity symbols having s bits. In a system that uses a Reed-Solomon ECC, a decoder such as one instance of the error detection logic 132 may detect up to 2t symbols containing errors or correct up to t symbols that contain errors in a respective codeword, where 2t=n−k. As is known in the art, a respective BCH code may be generated based on a corresponding code generator polynomial g(x) using a shift register with feedback. A suitable ECC may be selected based on acceptable overhead, implementation complexity and cost, additional latency to generate and decode the ECC, and an acceptable corrected BER.

In other embodiments of the controller 110, the retry remedial action may be based at least in part on retry information transmitted from a memory device, such as memory device 210, to the controller 110. In these embodiments, the retry information may include a request that the controller 110 re-transmit the respective write data 116 and/or command operation. Alternately, the retry information may include a request that the controller 110 re-transmit the respective write data 116 and/or command operation with at least a portion of the respective write data 116 and/or command operation having error protection provided by an ECC that is dynamically added by at least one of the error protection generators 130. The ECC may include one of the BCH codes.

In some embodiments, data may be re-transmitted by at least one memory device, such as the memory device 210, with an improved BER. For example, the retry information transmitted from the controller 110 to a memory device may include a request that the memory device re-transmit the respective read data 120; a request that at least the one memory device re-transmit the respective read data 120 using a circuit having a power greater than that used in a previous transmission for improved transmit characteristics;

a request that at least the one memory device re-transmit the respective read data 120 with one symbol per clock cycle (as opposed to transmitting on both rising and falling clock edges); a request that at least the one memory device re-transmit the respective read data 120 including an error correction code; a request that the memory device re-transmit the respective read data 120 at a data rate that is less than that used in the previous transmission by adjusting, for example, the clock generator 218 (FIG. 2B); a request that the memory device re-transmit the respective read data 120 in a data stream with blanks inserted before and after the respective read data 120 to have an intersymbol interference that is less than that in the previous transmission; a request that the memory device re-transmit the respective read data 120 with a different modulation code than that used in the previous transmission by adjusting, for example, the modulator 228 (FIG. 2B); a request that the memory device re-transmit the respective read data 120 with a voltage swing greater than that used in the previous transmission by adjusting, for example, the voltage generator 220 (FIG. 2B); a request that the memory device re-transmit the respective read data 120 using a number of pins that are coupled to one or more of the signal lines 144 that is less than the number of pins coupled to one or more of the signal lines 144 in the previous transmission; a request that the memory device re-transmit the respective read data 120 after a predetermined idle time; and/or a request that at least the one memory device re-transmit the respective read data 120 to another receiver 136 in the controller 110. The predetermined idle time may include several clock cycles.

In some embodiments of the controller 110, data may be re-transmitted by the controller 110 with an improved BER. For example, the retry information transmitted from a memory device, such as the memory device 210, to the controller 110 may include a request that the controller 110 re-transmit the respective write data 116 and/or command operation; a request that the controller 110 re-transmit the respective write data 116 and/or command operation using a circuit having a power greater than that used in a previous transmission for improved transmit characteristics; a request that the controller 110 re-transmit the respective write data 116 and/or command operation at a data rate that is less than that used in the previous transmission by adjusting the clock generator 142; a request that the controller 110 re-transmit the respective write data 116 and/or command operation in a data stream with blanks inserted before and after the respective write data 116 and/or command operation to have the intersymbol interference that is less than that in the previous transmission; a request that the controller 110 re-transmit the respective write data 116 with one symbol per clock cycle (as opposed to transmitting on both rising and falling clock edges); a request that the controller 110 re-transmit the respective write data 116 including an error correction code; a request that the controller 110 re-transmit the respective write data 116 and/or command operation with a different modulation code than that used in the previous transmission by adjusting the modulator 126; a request that the controller 110 re-transmit the respective write data 116 and/or command operation with a voltage swing greater than that in the previous transmission by adjusting the voltage generator 140; a request that the controller 110 re-transmit the respective write data 116 and/or command operation using a number of pins that are coupled to one or more of the signal lines 144 that is less than the number of pins coupled to one or more of the signal lines 144 in the previous transmission; a request that the controller 110 re-transmit the respective write data 116 and/or command operation after a predetermined idle time, and/or requesting that the controller 110 re-transmit the respective write data 116 and/or command operation to another receiver, such as one of the receivers 212 (FIG. 2B), in at least the one memory device. The predetermined idle time may have a duration of, for example, 1 symbol period or 2 symbol periods, where a symbol period is the amount of time associated with the transmission of each symbol of the write data.

FIGS. 3A and 3B illustrate data streams in a system with improved BER, using a mode of operation in a controller 110 or memory device 210 in which data is re-transmitted by the controller 110 or memory device 210. FIG. 3A illustrates a data stream in an embodiment in which a data packet 310, corresponding to the respective write data 116, a command operation or the respective read data 120, is re-transmitted in a data stream with blanks inserted 314 between the data packet 310 and other data packets 312 to reduce the intersymbol interference relative to the intersymbol interference in the previous transmission, either to the controller 110 or the memory device 210, without the blanks inserted 314 between the data packet 310. FIG. 3B illustrates a data stream in an embodiment in which a data packet 330, corresponding to the respective write data 116, a command operation or the respective read data 120, is re-transmitted with a voltage swing that is greater than the voltage swing for other data packets 332.

Referring to FIG. 2A, special handling may be needed for the retry remedial action in some embodiments of the controller 110 or memory device 210 in order to avoid data hazards. For example, the control logic 112 may delay subsequent write operation commands to a memory device, such as the memory device 210 (FIG. 2B), until the retry remedial action is completed, may delay command operations to a location in the memory device corresponding to the respective write data 116 or the respective read data 120 until the retry remedial action is completed and/or may reorder received read data after the retry remedial action is completed in order to restore the respective read data 120 received from the memory device during remedial action to a position corresponding to an original sequence of command operations.

Special handling during retry remedial action associated with the respective write data 116 may also be implemented using a memory buffer 122 in the controller 110. During a normal mode of operation, the write data transmitted to at least one memory device, such as the memory device 210, may be temporarily stored in the memory buffer 122. If a read command operation to a location in at least the one memory device corresponding to the respective write data 116 occurs during the retry remedial action, the respective write data 116 may be obtained from the memory buffer 122. In other words, the write data in the memory buffer 122 is used to respond to read requests to memory locations matching the memory locations of the buffered write data. In other embodiments, the respective write data 116 may be obtained from the write queue 114 if a read command operation to a location in at least the one memory device corresponding to the respective write data 116 occurs during the retry remedial action. This may not be possible, however, if a partial write is being performed using byte masking.

Figure 5:
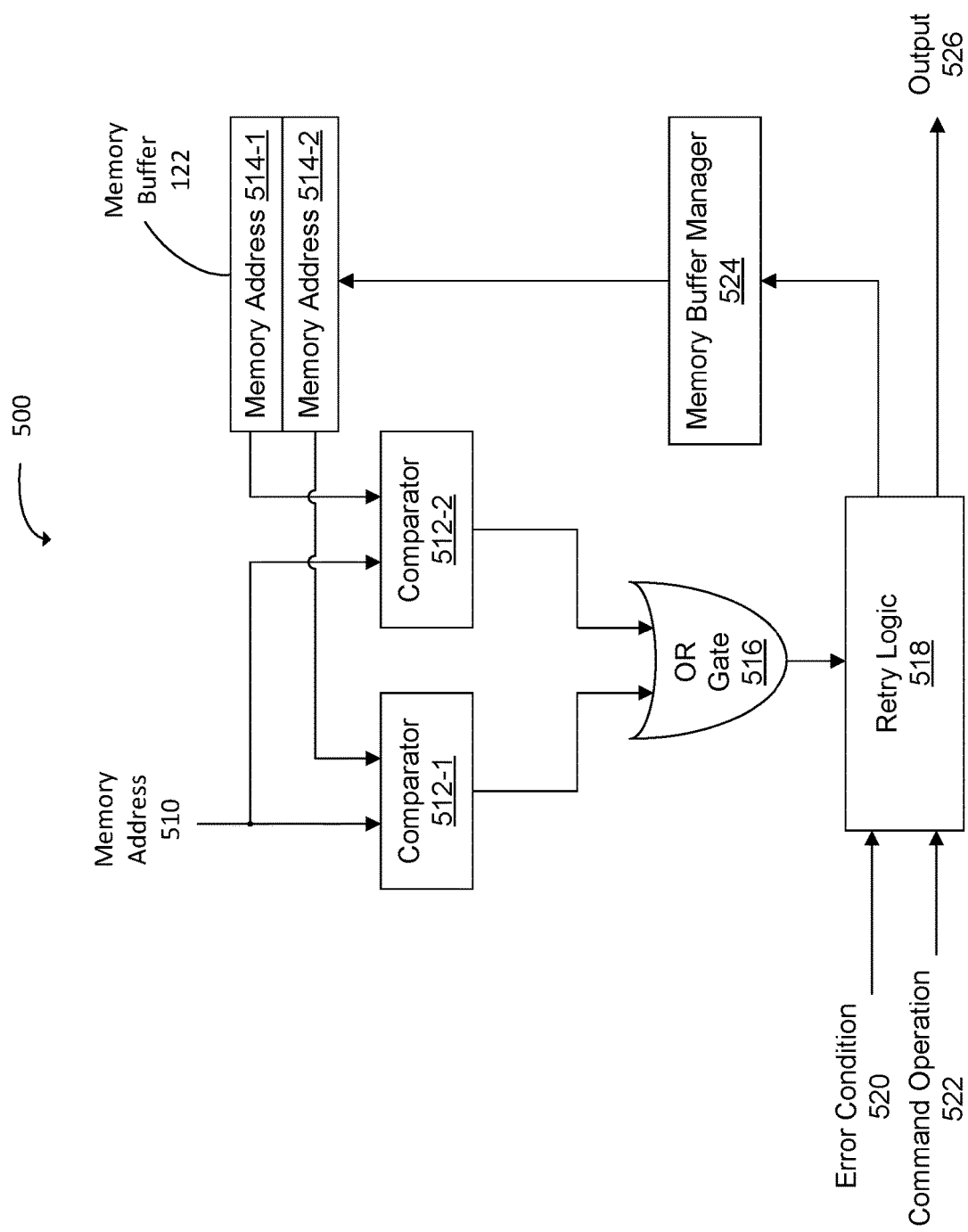
FIG. 5 is a block diagram illustrating management of a memory buffer in an embodiment of a memory system.

FIG. 5 illustrates an embodiment 500 for controlling the memory buffer 122. A memory address 510 corresponding to one or more command operations 522 is compared to memory addresses 514, corresponding to write data temporarily stored in the memory buffer 122, using comparators 512 and OR gate 516. During the normal mode of operation, memory buffer manager 524 may continuously store and remove write data from the memory buffer 122 when an opportunity occurs based on the command operations 522. The memory buffer 122 may be implemented as FIFO memory with one or more storage locations. Embodiment 500 illustrates a memory buffer 122 having two storage locations. When a respective error condition 520 is asserted, retry logic 518, which may be implemented in the control logic 112 (FIG. 2B), may instruct the memory buffer 122 to provide the respective write data 116, which is output on output 526. For example, as noted above, the retry logic 518 may instruct the memory buffer 122 to provide the respective write data 116 if a read command operation to one of the memory addresses 514 (each corresponding to a location in a memory device) occurs during the retry remedial action. When a memory buffer storage location is empty, its corresponding address 514 is set to a value outside the address range of the memory devices serviced by the memory buffer 122.

Referring to FIG. 2B, as also mentioned previously, when the respective error condition is asserted, the memory device 210 may enter a mode of operation where the retry logic performs the retry remedial action. In some embodiments, the retry remedial action performed in this mode of operation may include transmitting retry information from the memory device 210 to the controller 110 (FIG. 2A). The retry information may include a request that the controller 110 (FIG. 2A) re-transmit the respective write data 116 (FIG. 2A) and/or at least one command operation with at least a portion of the respective write data 116 (FIG. 2A) having error protection provided by an ECC that is dynamically generated in controller 110 (FIG. 2A). The ECC may be generating using, for example, one of the error protection generators 130. The ECC may include one of the BCH codes.

In other embodiments of the mode of operation in the memory device 210, the retry remedial action may be based at least in part on retry information transmitted from the controller 110 (FIG. 2A) to the memory device 210. In these embodiments, the retry information may include a request that the memory device 210 re-transmit the respective read data 120 (FIG. 2A) with at least a portion of the respective read data 120 (FIG. 2A) having error protection provided by an ECC that is dynamically added by at least one of the error protection generators 224. The ECC may include one of the BCH codes.

In some embodiments of the memory device 210, data may be re-transmitted by the memory device 210 with an improved BER. For example, the retry information transmitted from the controller 110 (FIG. 2A) to the memory device 210 may include a request that the memory device 210 re-transmit the respective read data 120 (FIG. 2A); a request that the memory device 210 re-transmit the respective read data 120 (FIG. 2A) using a circuit having a power than that used in a previous transmission for improved transmit characteristics; a request that the memory device 210 re-transmit the respective read data 120 (FIG. 2A) at a data rate that is less than that in the previous transmission by adjusting the clock generator 218; a request that the memory device 210 re-transmit the respective read data 120 (FIG. 2A) in a data stream with blanks inserted before and after the respective read data 120 to have the intersymbol interference that is less than the intersymbol interference in the previous transmission (as illustrated in FIG. 3A); a request that the memory device 210 re-transmit the respective read data 120 (FIG. 2A) with a different modulation code than that used in the previous transmission by adjusting the modulator 228; a request that the memory device 210 re-transmit the respective read data 120 (FIG. 2A) with a voltage swing greater than that in the previous transmission by adjusting the voltage generator 220 (as illustrated in FIG. 3B); a request that the memory device 210 re-transmit the respective read data 120 (FIG. 2A) using a number of pins that are coupled to one or more of the signal lines 144 that is less than the number of pins coupled to one or more of the signal lines 144 in the previous transmission; a request that the memory device 210 re-transmit the respective read data 120 (FIG. 2A) after a predetermined idle time; and/or a request that the memory device 210 re-transmit the respective read data 120 (FIG. 2A) to another receiver 136 (FIG. 2A) in the controller 110 (FIG. 2A). The predetermined idle time may have a duration of, for example, 1 symbol period or 2 symbol periods, where a symbol period is the amount of time associated with the transmission of each symbol of the read data.

Referring to FIG. 2A, in some embodiments of the memory device 210 (FIG. 2B), data may be re-transmitted by the controller 110 with an improved BER. For example, the retry information transmitted from the memory device 210 (FIG. 2B) to the controller 110 may include a request that the controller 110 re-transmit the respective write data 116 and/or command operation; a request that the controller 110 re-transmit the respective write data 116 and/or command operation using a circuit having a power greater than in a previous transmission for improved transmit characteristics; a request that the controller 110 re-transmit the respective write data 116 and/or command operation at a data rate less than in the previous transmission by adjusting the clock generator 142; a request that the controller 110 re-transmit the respective write data 116 and/or command operation in a data stream with blanks inserted before and after the respective write data 116 and/or command operation to have the intersymbol interference that is less than the intersymbol interference in the previous transmission; a request that the controller 110 re-transmit the respective write data 116 and/or command operation with a different modulation code than in the previous transmission by adjusting the modulator 126; a request that the controller 110 re-transmit the respective write data 116 and/or command operation with a voltage swing larger than in the previous transmission by adjusting the voltage generator 140; a request that the controller 110 re-transmit the respective write data 116 and/or command operation using a number of pins that are coupled to one or more of the signal lines 144 that is less than the number of pins that are coupled to one or more of the signal lines 144 in the previous transmission; a request that the controller 110 re-transmit the respective write data 116 and/or command operation after a predetermined idle time; and/or a request that the controller 110 re-transmit the respective write data 116 and/or command operation to another receiver 212 (FIG. 2B) in the memory device 210 (FIG. 2B). The predetermined idle time may have a duration of, for example, 1 symbol period or 2 symbol periods, where a symbol period is the amount of time associated with the transmission of each symbol of the write data.

Referring to FIG. 2B, special handling may be needed for the retry remedial action in some of the embodiments of the mode of operation of the memory device 210. For example, if an error is detected in a respective command operation on the command link, such as a read operation, the control logic 232 may use the mask logic 230 to mask the respective command operation from the storage array 234. Retry information may be transmitted to the controller 110 (FIG. 2A)

to ensure that the respective command operation is retransmitted by the controller 110.

Special handling during retry remedial action associated with the respective read data 120 (FIG. 2A) may be implemented using a memory buffer 236 in the memory device 210 to avoid data hazards. During a normal mode of operation, the read data transmitted to the controller 110 (FIG. 2A) may be temporarily stored in the memory buffer 236. If a read command operation to a location in the storage array 234, corresponding to respective read data 120 (FIG. 2A) in the memory buffer 236, occurs during the retry remedial action, the respective read data 120 (FIG. 2A) may be obtained from the memory buffer 236 instead of the storage array 234. In some embodiments, the memory buffer 236 may be included in the storage array 234.

In the various embodiments of the modes of operation for the controller 110 (FIG. 2A) and/or the memory device 210, the retry information may be transmitted using at least one command operation signal line, such as the signal line 144_1, at least one of the data signal lines, such as signal line 144_2, at least one dedicated retry signal line, such as the signal line 146 and/or at least one sub-channel, such as the passband sub-channel 418 (FIG. 4) corresponding to at least one band of frequencies in at least one of the signal lines 144 and/or 146. Communication using at least one signal line, such as the signal line 144_2, may be uni-direction or bi-direction, including simultaneous bi-directional communication or a dynamically configured communication direction.

Some memory systems may have command links, such as that on signal line 144_1, with data rates substantially lower than the data rate on signal links, such as signal lines 144_2 through 144_5. If the data rate of the command link is low enough that the effective BER over that link is sufficiently low, additional error protection, such as ECC, may not be needed. If the data rate over the command link is high enough that BER is higher than the acceptable level (such as data rates in the multi-GHz range) at least a portion of control or command packets, containing command operations, may be protected using an error detection code, such as parity bits or a parity code, and/or an ECC. As illustrated in embodiments 100 (FIG. 2A) and 200, error detection codes or error correction codes may be implemented using error protection generator 130-1 (FIG. 2A) and error detection logic 222-1.

While using an ECC to protect all portions of a command packet would protect all portions of the command packets equally, during the normal mode of operation in the controller 110 (FIG. 2A) a combination of an ECC on a selected portion of the command packet bits and an error detection code on a remainder may be useful in reducing the overhead. For example, an ECC could be used on the elective bit fields in the command packet. The elective bit fields are sensitive in the sense that they can cause erroneous operations that are difficult to recover from, such as row address and commands operations (activate, precharge, read, write, refresh). Less sensitive bit fields, such as column address, may only need error detection codes so that errors could be detected by at least one of the memory devices, such as the memory device 210. Retry information transmitted to the controller 110 (FIG. 2A) could instruct the controller 110 (FIG. 2A) to re-transmit the affected command packet in a mode of operation of the controller 110 (FIG. 2A).

Using an error detection code on all of the command packet during the normal mode of operation of the controller 110 (FIG. 2A) offers a lower overhead. This will, however, allow errors in the command packet to propagate to one or more memory devices, such as the memory device 210. This may result in erroneous memory operations and potential data corruption. Therefore, in these embodiments, the controller is configured to ignore the memory operation results (e.g., read data) produced when an error in a respective command packet is detected a memory devices. The controller is further configured to recover the original state of any memory device that received an erroneous memory command packet when an error in the command packet adversely affects the state of the memory device that received the command packet. Configuring the controller 110 to track and recover from all possible erroneous operations adds complexity to the controller 110. There may also be a performance penalty.

Referring to FIG. 2A, in the normal mode of operation for the controller 110 the flow of operations is as follows. When a write transaction or command operation WR1-X (where X is an address in at least one memory device) is received in the write queue 114, the control logic 112 may select WR1-X as a next transaction. At least one of the error protection generators 130 may generate error-detection information from the write data and/or command operation. The data and command are transmitted using at least one of the transmitters 134. The data and command are received in at least one of the memory devices, such as the memory device 210 (FIG. 2B). The error-detection information is checked using at least one error detection logic 222 (FIG. 2B). If an error is detected, the respective error condition is asserted. In some embodiments, incorrect write data is written to the address X in the storage array 234 (FIG. 2B). Retry information is asserted by the control logic 232 (FIG. 2B) and transmitted to the controller 110 using, for example, the retry link 146. Upon receiving the retry information, the controller 110 enters a special mode of operation. The controller 110 performs remedial actions during this mode of operation. The controller 110 may re-transmit the command operation and/or the write data. In some embodiments, re-transmission may use ECC on at least a portion of the write data and/or command operation, and/or may use relaxed conditions to improve the BER and avoid a second error. The write data is correctly received by the memory device 210 (FIG. 2B) and may overwrite incorrect data in the storage array 234 (FIG. 2B) at address X. The controller 110 then exits the special mode of operation.

If the read queue 118 receives a read transaction or command operation RD1-X while the controller 110 is in the special mode of operation associated with recovering from a write error to the memory device 210 (FIG. 2B), a write-read hazard has occurred. If the read transaction were allowed to proceed, it might return old data at address X in the storage array 234 (FIG. 2B) or incorrect new data at address X in the storage array 234 (FIG. 2B), as opposed to correct data that is to be written when the WR1-X transaction is re-transmitted during the remedial action. In some embodiments, the controller 110 holds the read transaction RD1-X in the read queue 118 until the re-transmitted write transaction has finished. Alternatively, in some embodiments the controller may allow the read transaction RD1-X in the read queue 118 to complete by returning write data for WR1-X that is stored in the write queue 114 or the memory buffer 122 for the read transaction. This may not be possible if WR1-X is a partial write (e.g., using byte masking) into address X in the storage array 234 (FIG. 2B), since part of the data needed for the RD1-X transaction may be in the memory device 210 (FIG. 2B) and another part may be in the write queue 114 or the memory buffer 122 in the controller 110.

Another flow of operations in the normal mode of operation for the controller 110 is as follows. The write queue 114 receives transaction or command operation WR2-X (where X is an address in at least one memory device). The control logic 112 may select WR2-X as the next transaction. At least one error protection generator 130 may generate error-detection information for the write command operation. The write command operation is transmitted using at least one transmitter 134 to at least one memory device, such as the memory device 210 (FIG. 2B). The write command operation is received in the memory device 210 (FIG. 2B). The error-detection information is checked using at least one error detection logic 222 (FIG. 2B). If an error is detected, the respective error condition is asserted. In some embodiments, the incorrect write command operation is masked from the storage array 234 (FIG. 2B). Retry information is asserted by the control logic 232 (FIG. 2B) and transmitted to the controller 110 using, for example, the retry link 146. Upon receiving the retry information, the controller 110 enters a special mode of operation. The controller 110 performs remedial actions in this mode of operation. The controller 110 may re-transmit the write command operation. In some embodiments, re-transmission may use an ECC on at least a portion of the write command operation and/or relaxed conditions to improve the BER and avoid a second error. When the write command operation is correctly received by the memory device 210 (FIG. 2B), the controller 110 exits the special mode of operation.

Referring to FIG. 2B, yet another flow of operations in the normal mode of operation for the controller 110 is as follows. The read queue 118 receives a transaction or command operation RD2-X (where X is an address in at least one memory device). The control logic 112 may select RD2-X as the next transaction. At least one error protection generator 130 may generate error-detection information for the read command operation. The read command operation is transmitted using at least one transmitter 134 to at least one memory device, such as the memory device 210. The read command operation is received in the memory device 210. The error-detection information is checked by the memory device using at least one error detection logic 222. The control logic 232 in the memory device 210 accesses the read data at address X in the storage array 234. At least one error protection generator 224 may generate error-detection information for the read data. The read data is transmitted using at least one of the memory device's transmitters 214, and is then received in the controller 110. The error-detection information is checked using at least one error detection logic 132. If an error is detected, the respective error condition is asserted and the controller 110 enters a special mode of operation. The incorrect read data may be discarded. The controller 110 performs remedial actions in the special mode of operation. The controller 110 may transmit retry information to the memory device 210 (FIG. 2B) using, for example, the retry link 146. Upon receiving the retry information, the memory device 210 (FIG. 2B) may re-transmit the read data. In some embodiments, re-transmission may use an ECC on at least a portion of the read data and/or relaxed conditions to improve the BER and avoid a second error. When the read data is correctly received by the controller 110, the controller 110 exits the special mode of operation.

If the write queue 114 receives a write transaction or command operation WR3-X while the controller 110 in the special mode of operation associated with a read error from the memory device 210 (FIG. 2B), a read-write hazard has occurred. If the write transaction were allowed to proceed, it might overwrite the old data at address X in the storage array 234 (FIG. 2B) that is to be read when the RD2-X transaction is re-transmitted during the remedial action. In some embodiments, the controller 110 holds the write transaction WR3-X in the write queue 114 until the re-transmitted read transaction has finished.

Figure 6:
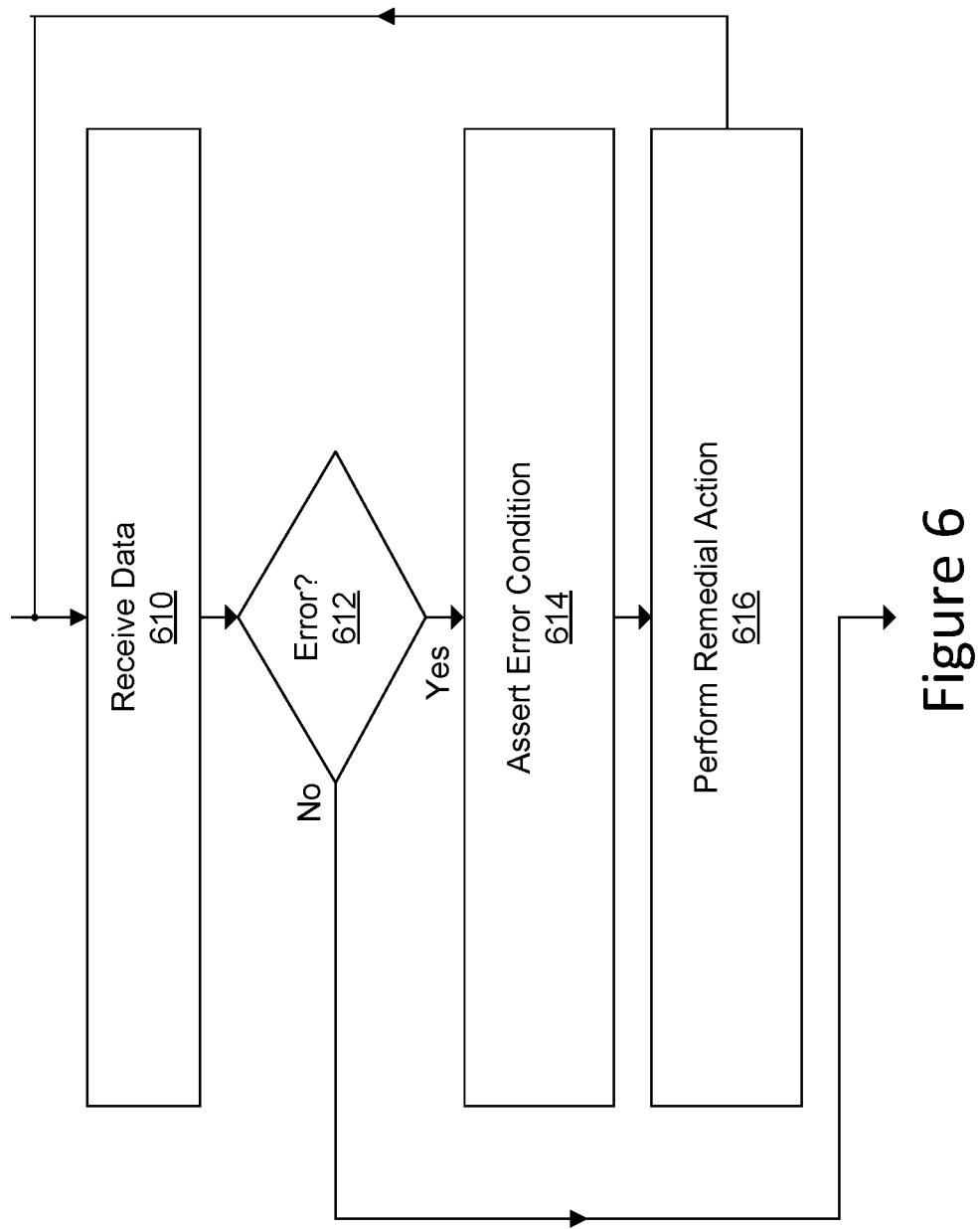
FIG. 6 is a flow diagram illustrating a method of operation of an embodiment of a memory system.

FIG. 6 illustrates an embodiment of a method or process for the error detection and remedial action in either the controller 110 or the memory device 210 (FIG. 2B). Data is received (610). A determination is made if an error occurred (612). If no error occurred, the procedure continues. If an error occurred, an error condition is asserted (614), remedial action is performed (616) and the procedure repeats. In some embodiments, there may be fewer or additional operations, an order of the operations may be rearranged and/or two or more operations may be combined.

Figure 7:
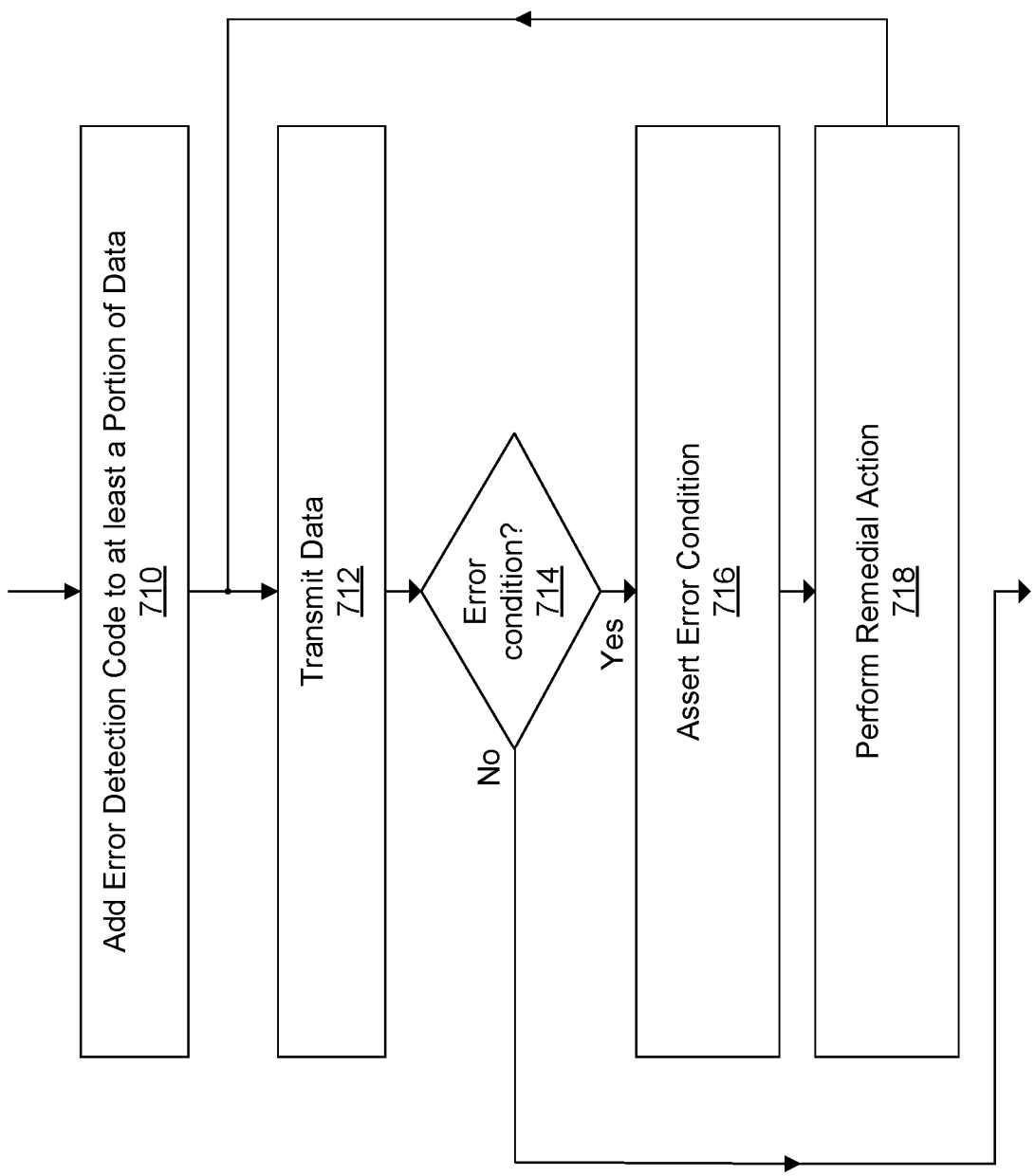
FIG. 7 is a flow diagram illustrating a method of operation of an embodiment of a memory system.

FIG. 7 illustrates an embodiment of a method or process for the error detection and remedial action in either the controller 110 or the memory device 210. An error detection code is added to at least a portion of data (710). The data is transmitted (712). A determination is made if an error occurred (714). If no error occurred, the procedure continues. If an error occurred, an error condition is asserted (716), a remedial action is performed (718) and the procedure repeats, starting at the data transmission operation (712). In some embodiments, there may be fewer or additional operations, an order of the operations may be rearranged and/or two or more operations may be combined.

The error detection and retry modes of operation and method are well-suited for use in improving communication in memory systems and devices. They are also well-suited for use in improving communication between a memory controller chip and a DRAM chip. The DRAM chip may be either on the same printed circuit board as the controller or embedded in a memory module. The apparatus and methods described herein may also be applied to other memory technologies, such as static random access memory (SRAM) and electrically erasable programmable read-only memory (EEPROM).

Devices and circuits described herein can be implemented using computer aided design tools available in the art, and embodied by computer readable files containing software descriptions of such circuits, at behavioral, register transfer, logic component, transistor and layout geometry level descriptions stored on storage media or communicated by carrier waves. Data formats in which such descriptions can be implemented include, but are not limited to, formats supporting behavioral languages like C, formats supporting register transfer level RTL languages like Verilog and VHDL, and formats supporting geometry description languages like GDSII, GDSIII, GDSIV, CIF, MEBES and other suitable formats and languages. Data transfers of such files on machine readable media including carrier waves can be done electronically over the diverse media on the Internet or through email, for example. Physical files can be implemented on machine readable media such as 4 mm magnetic tape, 8 mm magnetic tape, 3½ inch floppy media, CDs, DVDs and so on.

Figure 8:
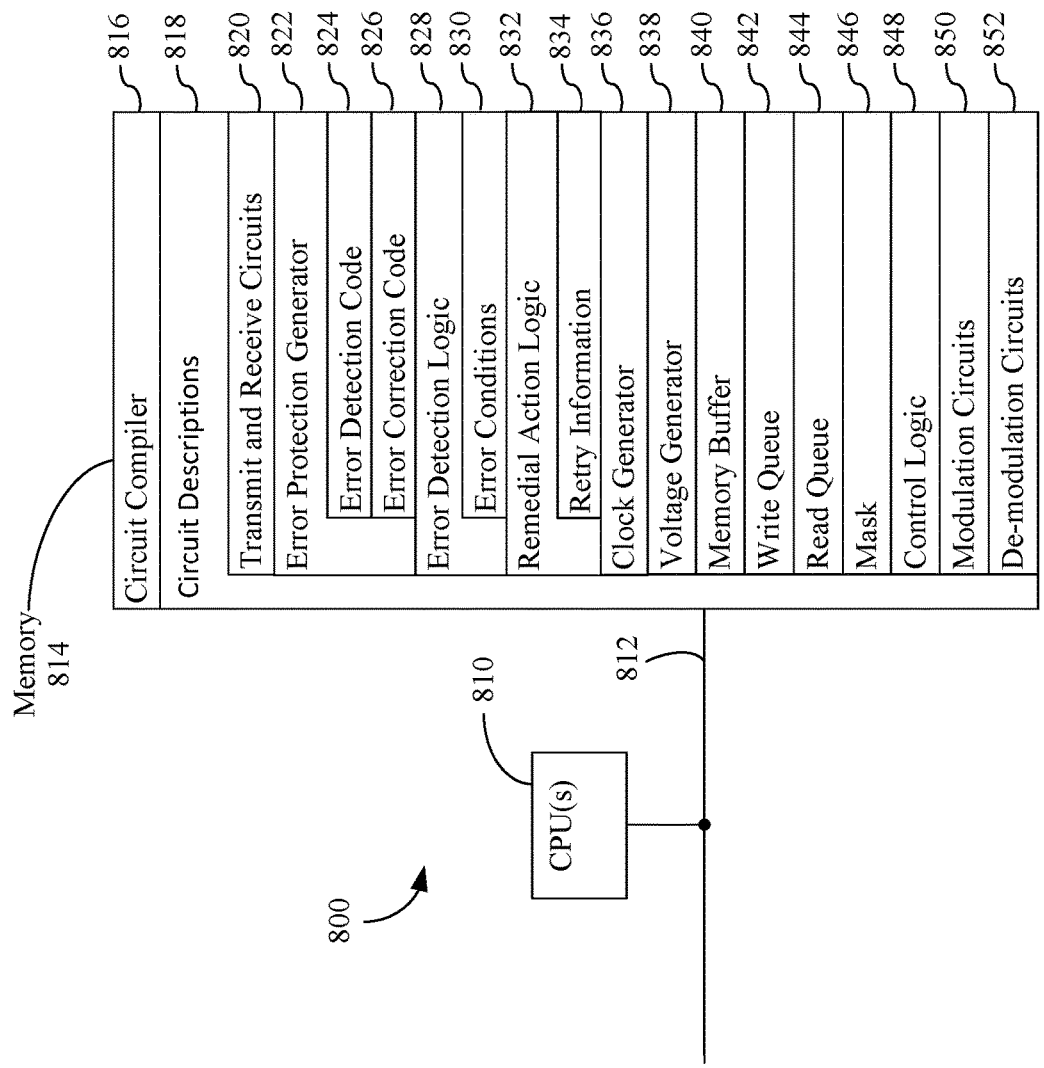
FIG. 8 is a block diagram illustrating an embodiment of a memory system.

FIG. 8 is a block diagram an embodiment of a system 800 for storing computer readable files containing software descriptions of the circuits. The system 800 may include at least one data processor or central processing unit (CPU) 810, a memory 814 and one or more signal lines 812 for coupling these components to one another. The one or more signal lines 812 may constitute one or more communications busses.

The memory 814 may include high-speed random access memory and/or non-volatile memory, such as one or more magnetic disk storage devices. The memory 814 may store a circuit compiler 816 and circuit descriptions 818. The circuit descriptions 818 may include circuit descriptions for transmit and receive circuits 820, one or more error protection generators 822, error detection logic 828, remedial action logic 832, a clock generator 836, voltage generator 838, memory buffer 840, write queue 842, read queue 844, mask 846, control logic 848, modulation circuits 850 and de-modulation circuits 852. The error protection generator 822 may include error detection code 824 and error correction code 826. The error detection logic 828 may include error conditions 830. The remedial action logic 832 may include retry information 834.

In an alternate embodiment, the memory device includes a link interface, at least one transmitter coupled to the link interface to transmit the second data, an error protection generator coupled to the transmitter, a storage array for storing data, at least one receiver coupled to the link interface to receive the first data, and error detection logic to determine if the first data received by the memory device contains at least one error and, if an error is detected, to assert an error condition. The error protection generator may dynamically add an error detection code to at least a portion of the second data. The memory device may perform a retry remedial action if a respective error condition is asserted. The retry remedial action may enable transmit and receive data rates greater than a first threshold with an error rate lower than a second threshold.

The retry remedial action may include retry information transmitted from the memory device to the controller, which is coupled to the memory device using a link having one or more signal lines. The retry information may include requesting that the controller re-transmit the first data, requesting that the controller re-transmit the first data using a circuit having a power greater than that used in a previous transmission for improved transmit characteristics, requesting that the controller re-transmit the first data at a data rate less than that in the previous transmission, requesting that the controller re-transmit the first data in a data stream with blanks inserted before and after the first data to have the intersymbol interference that is less than the intersymbol interference in the previous transmission, requesting that the controller re-transmit the first data with one symbol per clock cycle, requesting that the controller re-transmit the first data including an error correction code, requesting that the controller re-transmit the first data with a different modulation code than that in the previous transmission, requesting that the controller re-transmit the first data with a voltage swing greater than that in the previous transmission, requesting that the controller re-transmit the first data using a number of pins that are coupled to the link that is less than the number of pins coupled to the link in the previous transmission, requesting that the controller re-transmit the first data after a predetermined idle time, and/or requesting that the controller re-transmit the first data to another receiver in the memory device.

The retry information may be transmitted to the controller using a command operation signal line in the link, a data signal line in the link, a dedicated retry signal line, and/or a sub-channel corresponding to at least one band of frequencies in the link.

The retry remedial action may include retry information transmitted from the memory device to the controller. The retry information may include requesting that the controller re-transmit the first data with at least a portion of the first data having error protection provided by an error correction code that is dynamically generated.

The error correction code may include a Bose-Chaudhuri-Hochquenghem (BCH) code.

The memory device may further include control logic. The first data may be a read command operation and the control logic may mask the read command operation from the storage array.

In another embodiment, the memory device includes a link interface, at least one transmitter coupled to the link interface to transmit the second data, an error protection generator coupled to the transmitter, a storage array for storing data, at least one receiver coupled to the link interface to receive the first data, and error detection logic to determine if the first data received by the memory device contains at least one error and, if an error is detected, to receive an error condition. The error protection generator may dynamically add an error detection code to at least a portion of the second data. The memory device may perform a retry remedial action if a respective error condition is received. The retry remedial action may enable transmit and receive data rates greater than a first threshold with an error rate lower than a second threshold. The retry remedial action may include re-transmitting the second data to a controller when the controller determines that the second data received by the controller from the memory device contains at least one error, asserts the error condition and notifies the memory device.

The retry remedial action may be based at least in part on retry information transmitted from the controller to the memory device using a link. The retry information may include requesting that the memory device re-transmit the second data, requesting that the memory device re-transmit the second data using a circuit having a power greater than that used in a previous transmission for improved transmit characteristics, requesting that the memory device re-transmit the second data at a data rate that is less than that in the previous transmission, requesting that the memory device re-transmit the second data with in a data stream with blanks inserted before and after the second data to have the intersymbol interference that is less than the intersymbol interference in the previous transmission, requesting that the memory device re-transmit the second data with one symbol per clock cycle, requesting that the memory device re-transmit the second data including an error correction code, requesting that the memory device re-transmit the second data with a different modulation code than that in the previous transmission, requesting that the memory device re-transmit the second data with a voltage swing greater than that in the previous transmission, requesting that the memory device re-transmit the second data using a number of pins that are coupled to the link that is less than the number of pins coupled to the link in the previous transmission, requesting that the memory device re-transmit the second data after a predetermined idle time, and/or requesting that the memory device re-transmit the second data to another receiver in the controller.

The retry information may be transmitted to the memory device using a command operation signal line in the link, a data signal line in the link, a dedicated retry signal line, and/or a sub-channel corresponding to at least one band of frequencies in the link.

The error protection generator may dynamically add an error correction code to at least a portion of the second data transmitted during retry remedial action. The retry remedial action may be based at least in part on retry information transmitted from the controller to the memory device.

The memory device may further include a memory buffer. The second data transmitted to the controller is temporarily stored in the memory buffer and, if a read to a location in the memory device corresponding to the second data occurs during the retry remedial action, the second data is obtained from the memory buffer.

In another embodiment, a computer readable medium containing data representing a circuit includes a memory device. The memory device includes a link interface, at least one transmitter coupled to the link interface to transmit the second data, an error protection generator coupled to the transmitter, a storage array for storing data, at least one receiver coupled to the link interface to receive the first data, and error detection logic to determine if the first data received by the memory device contains at least one error and, if an error is detected, to assert an error condition. The error protection generator may dynamically add an error detection code to at least a portion of the second data. The memory device may perform a retry remedial action if a respective error condition is asserted. The retry remedial action may enable transmit and receive data rates greater than a first threshold with an error rate lower than a second threshold.

In another embodiment, a computer readable medium containing data representing a circuit includes a memory device. The memory device includes a link interface, at least one transmitter coupled to the link interface to transmit the second data, an error protection generator coupled to the transmitter, a storage array for storing data, at least one receiver coupled to the link interface to receive the first data, and error detection logic to determine if the first data received by the memory device contains at least one error and, if an error is detected, to receive an error condition. The error protection generator may dynamically add an error detection code to at least a portion of the second data. The memory device may perform a retry remedial action if a respective error condition is received. The retry remedial action may enable transmit and receive data rates greater than a first threshold with an error rate lower than a second threshold. The retry remedial action may include re-transmitting the second data to a controller when the controller determines that the second data received by the controller from the memory device contains at least one error, asserts the error condition and notifies the memory device.

In another embodiment, a memory mechanism includes a link interface, a first means coupled to the link interface to transmit the second data, an error protection means coupled to the first means, a storage means for storing data, a second means coupled to the link interface to receive the first data, and error detection means to determine if the first data received by the memory device contains at least one error and, if an error is detected, to assert an error condition. The error protection means may dynamically add an error detection code to at least a portion of the second data. The memory mechanism may perform a retry remedial action if a respective error condition is asserted. The retry remedial action may enable transmit and receive data rates greater than a first threshold with an error rate lower than a second threshold.

In another embodiment, a memory mechanism includes a link interface, a first means coupled to the link interface to transmit the second data, an error protection means coupled to the first means, a storage means for storing data, a second means coupled to the link interface to receive the first data, and error detection means to determine if the first data received by the memory device contains at least one error and, if an error is detected, to receive an error condition. The error protection means may dynamically add an error detection code to at least a portion of the second data. The memory mechanism may perform a retry remedial action if a respective error condition is received. The retry remedial action may enable transmit and receive data rates greater than a first threshold with an error rate lower than a second threshold. The retry remedial action may include re-transmitting the second data to a controller when the controller determines that the second data received by the controller from the memory device contains at least one error, asserts the error condition and notifies the memory device.

The foregoing descriptions of specific embodiments of the present invention are presented for purposes of illustration and description. They are not intended to be exhaustive or to limit the invention to the precise forms disclosed. Rather, it should be appreciated that many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A memory device, comprising:
   at least one memory array;
   a link interface to receive commands from a memory controller;
   error information generation circuitry to generate error information in connection with a data packet, the data packet accessed from the at least one memory array of the memory device in response to a first command received at the link interface;
   transmitter circuitry to transmit to the memory controller the data packet along with the error information;
   receiver circuitry to receive write data from the memory controller in association with a write command; and
   error detection circuitry to detect an error in the write command and to responsively mask the write command from accessing the at least one memory array.

2. The memory device of claim 1, wherein the at least one memory array comprises one or more arrays of dynamic random access memory (DRAM) cells.

3. The memory device of claim 1, wherein the memory device further comprises circuitry to signal an error condition to the memory controller responsive to detection of the error in the write command.

4. The memory device of claim 3, wherein the circuitry to signal is to signal the error condition to the memory controller via a link not used for exchange of write data or read data with the memory controller.

5. The memory device of claim 1, wherein the error information comprises a cyclic code.

6. The memory device of claim 1, further comprising a buffer to store a first instance of the data packet until a retry remedial event is executed in the event that the memory controller detects, dependent on the error information, at least one error in the first instance of the data packet.

7. The memory device of claim 6, wherein the retry remedial action is to include transmission by the memory device to the memory controller of the second instance of the data packet at a different data rate than the data rate than used by the memory device in the transmission of the first instance of the data packet to the memory controller.

8. The memory device of claim 6, wherein the first instance of the data packet is to be transmitted by the memory device to the memory controller using symbols respectively transmitted on rising and falling edges of the clock signal, and wherein the memory device comprises circuitry to, in the event that the memory controller the at least one error in the first instance of the data packet, receive from the memory controller an indication that a retry is to be attempted, and responsively transmit a second instance of the data packet to the memory controller using one symbol per cycle of the clock signal.

9. The memory device of claim 8, wherein the memory device comprises circuitry to transmit the second instance of the data packet using at least one of:
blanks attached relative to the first instance of the data packet; or
a larger voltage swing than a voltage swing used in transmission of the first instance of the data packet.

10. The memory device of claim 1, wherein the memory device comprises circuitry to detect an error in the write data, and in response to detection of an error in the write data, to transmit an indication of error to the memory controller.

11. The memory device of claim 10, wherein the memory device is to permit storage of the write data in the at least one memory array, notwithstanding error in the write data, in absence of detected error in the write command.

12. A memory device, comprising:
at least one memory array;
a link interface to receive commands from a memory controller;
error information generation circuitry to generate error information, comprising a cyclic code, in connection with a data packet, the data packet accessed from the at least one memory array of the memory device in response to a first command received at the link interface;
transmitter circuitry to transmit to the memory controller the data packet along with the error information;
receiver circuitry to receive write data from the memory controller in association with a write command; and
error detection circuitry to detect an error in the write command and to responsively mask the write command from accessing the at least one memory array;
wherein the memory device further comprises circuitry to signal an error condition to the memory controller responsive to detection of the error in the write command.

13. The memory device of claim 12, wherein the at least one memory array comprises one or more arrays of dynamic random access memory (DRAM) cells.

14. The memory device of claim 12, wherein the circuitry to signal is to signal the error condition to the memory controller via a link not used for exchange of write data or read data with the memory controller.

15. The memory device of claim 12, further comprising a buffer to store a first instance of the data packet until a retry remedial event is executed in the event that the memory controller detects, dependent on the error information, at least one error in the first instance of the data packet.

16. The memory device of claim 15, wherein the retry remedial action is to include transmission by the memory device to the memory controller of the second instance of the data packet at a different data rate than the data rate than used by the memory device in the transmission of the first instance of the data packet to the memory controller.

17. The memory device of claim 15, wherein the first instance of the data packet is to be transmitted by the memory device to the memory controller using symbols respectively transmitted on rising and falling edges of the clock signal, and wherein the memory device comprises circuitry to, in the event that the memory controller the at least one error in the first instance of the data packet, receive from the memory controller an indication that a retry is to be attempted, and responsively transmit a second instance of the data packet to the memory controller using one symbol per cycle of the clock signal.

18. The memory device of claim 17, wherein the memory device comprises circuitry to transmit the second instance of the data packet using at least one of:
blanks attached relative to the first instance of the data packet; or
a larger voltage swing than a voltage swing used in transmission of the first instance of the data packet.

19. The memory device of claim 12, wherein the memory device comprises circuitry to detect an error in the write data, and in response to detection of an error in the write data, to transmit an indication of error to the memory controller.

20. The memory device of claim 19, wherein the memory device is to permit storage of the write data in the at least one memory array, notwithstanding error in the write data, in absence of detected error in the write command.

21. A memory device, comprising:
at least one memory array;
a link interface to receive commands from a memory controller;
error information generation circuitry to generate error information in connection with a data packet, the data packet accessed from the at least one memory array of the memory device in response to a first command received at the link interface;
transmitter circuitry to transmit to the memory controller the data packet along with the error information;
receiver circuitry to receive write data from the memory controller in association with a write command; and
error detection circuitry to detect an error in the write command and to responsively mask the write command from accessing the at least one memory array;
wherein
the memory device further comprises circuitry to signal an error condition to the memory controller responsive to detection of the error in the write command, and
the memory device comprises circuitry to detect an error in the write data, and to permit storage of the write data in the at least one memory array, notwithstanding error in the write data, in absence of detected error in the write command.

* * * * *